(12) United States Patent
Park et al.

(10) Patent No.: US 11,600,553 B2
(45) Date of Patent: *Mar. 7, 2023

(54) SEMICONDUCTOR DEVICE INCLUDING THROUGH SUBSTRATE VIAS AND METHOD OF MANUFACTURING THE SEMICONDUCTOR DEVICE

(71) Applicant: Samsung Electronics Co., Ltd., Suwon-si (KR)

(72) Inventors: Myungjoo Park, Pohang-si (KR); Jaewon Hwang, Seongnam-si (KR); Kwangjin Moon, Hwaseong-si (KR); Kunsang Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 2 days.

This patent is subject to a terminal disclaimer.

(21) Appl. No.: 17/381,287

(22) Filed: Jul. 21, 2021

(65) Prior Publication Data

US 2021/0351112 A1    Nov. 11, 2021

Related U.S. Application Data

(63) Continuation of application No. 16/795,686, filed on Feb. 20, 2020, now Pat. No. 11,101,196.

(30) Foreign Application Priority Data

Jul. 17, 2019   (KR) .......................... 10-2019-0086635

(51) Int. Cl.
*H01L 23/48* (2006.01)
*H01L 23/538* (2006.01)
(Continued)

(52) U.S. Cl.
CPC ........ *H01L 23/481* (2013.01); *H01L 21/4846* (2013.01); *H01L 23/5386* (2013.01); *H01L 24/05* (2013.01); *H01L 24/13* (2013.01)

(58) Field of Classification Search
CPC .............. H01L 23/481; H01L 23/5386; H01L 21/4846; H01L 24/13; H01L 24/05
See application file for complete search history.

(56) References Cited

U.S. PATENT DOCUMENTS

| 4,851,890 A | 7/1989 | Miyatake |
| 6,346,479 B1 * | 2/2002 | Woo ..................... H01L 21/2885 438/626 |

(Continued)

FOREIGN PATENT DOCUMENTS

| JP | 5023505 B2 | 9/2012 |
| KR | 100498454 B1 | 7/2005 |
| KR | 1020130053338 A | 5/2013 |

*Primary Examiner* — Mamadou L Diallo
(74) *Attorney, Agent, or Firm* — Muir Patent Law, PLLC

(57) ABSTRACT

A semiconductor device and a method of manufacturing the semiconductor device are disclosed. The semiconductor device includes a substrate, a first through substrate via configured to penetrate at least partially through the substrate, the first through substrate via having a first aspect ratio, and a second through substrate via configured to penetrate at least partially through the substrate. The second through substrate via has a second aspect ratio greater than the first aspect ratio, and each of the first through substrate via and the second through substrate via includes a first conductive layer and a second conductive layer. A thickness in a vertical direction of the first conductive layer of the first through substrate via is less than a thickness in the vertical direction of the first conductive layer of the second through substrate via.

20 Claims, 30 Drawing Sheets

(51) Int. Cl.
*H01L 21/48* (2006.01)
*H01L 23/00* (2006.01)

(56) References Cited

U.S. PATENT DOCUMENTS

| | | | |
|---|---|---|---|
| 6,475,903 B1 | 11/2002 | Gardner | |
| 6,548,395 B1* | 4/2003 | Woo | H01L 21/76877 257/E21.585 |
| 6,709,970 B1* | 3/2004 | Park | H01L 21/76877 438/626 |
| 7,247,558 B2* | 7/2007 | Basol | H01L 21/32125 257/E21.175 |
| 7,955,970 B2* | 6/2011 | Sunayama | C25D 5/18 438/654 |
| 7,968,455 B2 | 6/2011 | Lin et al. | |
| 8,703,615 B1 | 4/2014 | Ponnuswamy et al. | |
| 8,884,440 B2 | 11/2014 | Kim et al. | |
| 9,245,798 B2 | 1/2016 | Emesh et al. | |
| 9,269,612 B2* | 2/2016 | Chen | H01L 21/76819 |
| 9,496,145 B2 | 11/2016 | Lam et al. | |
| 2009/0243074 A1* | 10/2009 | Ramiah | H01L 21/76898 438/109 |
| 2011/0026232 A1* | 2/2011 | Lin | H01L 21/76898 361/760 |
| 2012/0018851 A1* | 1/2012 | Farooq | H01L 21/76898 257/E21.597 |
| 2013/0099368 A1* | 4/2013 | Han | H01L 23/13 257/713 |
| 2013/0119547 A1* | 5/2013 | Kim | H01L 21/76898 257/774 |
| 2013/0127055 A1* | 5/2013 | Chen | H01L 21/76819 438/653 |
| 2013/0230985 A1* | 9/2013 | Law | H01L 21/76898 438/667 |
| 2014/0061930 A1* | 3/2014 | Holmes | H01L 21/76831 257/769 |
| 2015/0322587 A1 | 11/2015 | Pabelico et al. | |
| 2017/0345737 A1* | 11/2017 | Edelstein | H01L 21/2885 |
| 2020/0243422 A1* | 7/2020 | Kim | H01L 23/49816 |

* cited by examiner

SEMICONDUCTOR DEVICE INCLUDING THROUGH SUBSTRATE VIAS AND METHOD OF MANUFACTURING THE SEMICONDUCTOR DEVICE

CROSS-REFERENCE TO RELATED APPLICATION

This nonprovisional application is a continuation of U.S. patent application Ser. No. 16/795,686, filed Feb. 20, 2020, in the U.S. Patent and Trademark Office, which claims the benefit of Korean Patent Application No. 10-2019-0086635, filed on Jul. 17, 2019, in the Korean Intellectual Property Office, the entire disclosures of both of which are incorporated herein by reference.

BACKGROUND

The technical idea of the inventive concept relates to a semiconductor device and a method of manufacturing the same. More particularly, the inventive concept relates to a semiconductor device including through substrate vias and a method of manufacturing the semiconductor device.

The through substrate vias may be used to connect a semiconductor chip to another semiconductor chip or to a package substrate. For example, through substrate vias may be used in various semiconductor devices such as an image sensor, a stacked memory, or an interposer. A connection method using through substrate vias may be advantageous in terms of speed, power consumption, and/or miniaturization compared to a connection method using wire bonding.

SUMMARY

The inventive concept provides a semiconductor device including through substrate vias of different aspect ratios including no voids.

According to an aspect of the inventive concept, there is provided a semiconductor device including: a substrate; a first through substrate via configured to penetrate at least partially through the substrate, the first through substrate via having a first aspect ratio; and a second through substrate via configured to penetrate at least partially through the substrate, the second through substrate via having a second aspect ratio, wherein each of the first through substrate via and the second through substrate via includes a first conductive layer and a second conductive layer, and a thickness in a vertical direction of the first conductive layer of the first through substrate via is less than a thickness in the vertical direction of the first conductive layer of the second through substrate via.

According to another aspect of the inventive concept, there is provided a semiconductor device including: a substrate; an integrated circuit on a bottom surface of the substrate; a first through substrate via configured to at least partially penetrate through the substrate, the first through substrate via having a first diameter; a second through substrate via configured to at least partially penetrate through the substrate, the second through substrate via having a second diameter less than the first diameter; a via insulating layer between the first through substrate via and the substrate, and between the second through substrate via and the substrate; two top pads including a first top pad and a second top pad, the first top pad on a top end of the first through substrate via and the second top pad on a top end of the second through substrate via; two bottom pads including a first bottom pad and a second bottom pad, the first bottom pad on a bottom end of the first through substrate via and the second bottom pad on a bottom end of the second through substrate via; and two bumps including a first bump and a second bump, the first bump on the first bottom pad and the second bump on the second bottom pad, wherein each of the first through substrate via and the second through substrate via includes a bottom conductive layer in a bottom portion of each of the first through substrate via and the second through substrate via, and a top conductive layer in a top portion of each of the first through substrate via and the second through substrate via, and a thickness in a vertical direction of the top conductive layer of the first through substrate via is less than a thickness in the vertical direction of the top conductive layer of the second through substrate via.

According to another aspect of the inventive concept, there is provided a semiconductor device including: a package substrate; a first semiconductor chip on the package substrate; and a second semiconductor chip on the first semiconductor chip, wherein the first semiconductor chip includes: a substrate; a first through substrate via configured to at least partially penetrate through the substrate of the first semiconductor chip; a second through substrate via configured to at least partially penetrate through the substrate of the first semiconductor chip, the second through substrate via having an aspect ratio greater than an aspect ratio of the first through substrate via; a first barrier layer between the substrate and the first through substrate via; and a second barrier layer between the substrate and the second through substrate via; wherein each of the first through substrate via and the second through substrate via of the first semiconductor chip includes a first conductive layer and a second conductive layer, and a thickness in a vertical direction of the first conductive layer of the first through substrate via is less than a thickness in the vertical direction of the first conductive layer of the second through substrate via.

According to another aspect of the inventive concept, there is provided a method of manufacturing a semiconductor device, the method including: providing a substrate having a first surface and a second surface facing each other; forming a first hole extending from the first surface of the substrate toward the second surface of the substrate and having a first aspect ratio, and a second hole extending from the first surface of the substrate toward the second surface of the substrate and having a second aspect ratio greater than the first aspect ratio; forming a first conductive layer on the first surface of the substrate, in the first hole, and in the second hole; reflowing the first conductive layer; and forming a second conductive layer on the first conductive layer such that the second conductive layer fills a remaining portion of each of the first hole and the second hole.

According to another aspect of the inventive concept, there is provided a method of manufacturing a semiconductor device, the method including: providing a substrate having a first surface and a second surface facing each other; forming an integrated circuit on the first surface of the substrate and a first interlayer insulating layer covering the integrated circuit; forming a first hole configured to penetrate through the first interlayer insulating layer of the substrate, extending from the first surface of the substrate toward the second surface, and having a first planar cross-sectional area, and a second hole configured to penetrate through the first interlayer insulating layer of the substrate, extending from the first surface of the substrate toward the second surface, and having a second planar cross-sectional area less than the first planar cross-sectional area; forming a first conductive layer on the first interlayer insulating layer, in the first hole, and in the second hole; reflowing the first conductive layer; and forming a second conductive layer on the first conductive layer such that the second conductive layer fills a remaining portion of each of the first hole and the second hole.

According to another aspect of the inventive concept, there is provided a method of manufacturing a semiconductor device, the method including: providing a substrate having a first surface and a second surface facing each other; forming an integrated circuit on the first surface of the substrate and a first interlayer insulating layer covering the integrated circuit; forming wirings and a second interlayer insulating layer on the first interlayer insulating layer; thinning the substrate by removing a portion of the substrate extending from the second surface of the substrate toward the first surface such that a third surface facing the first surface is formed; forming a first hole and a second hole each extending from the third surface of the substrate to the first surface of the substrate, and having different planar cross-sectional areas from each other; forming a first conductive layer on the third surface of the substrate, in the first hole, and in the second hole; reflowing the first conductive layer; and forming a second conductive layer on the first conductive layer such that the second conductive layer fills a remaining portion of each of the first hole and the second hole.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
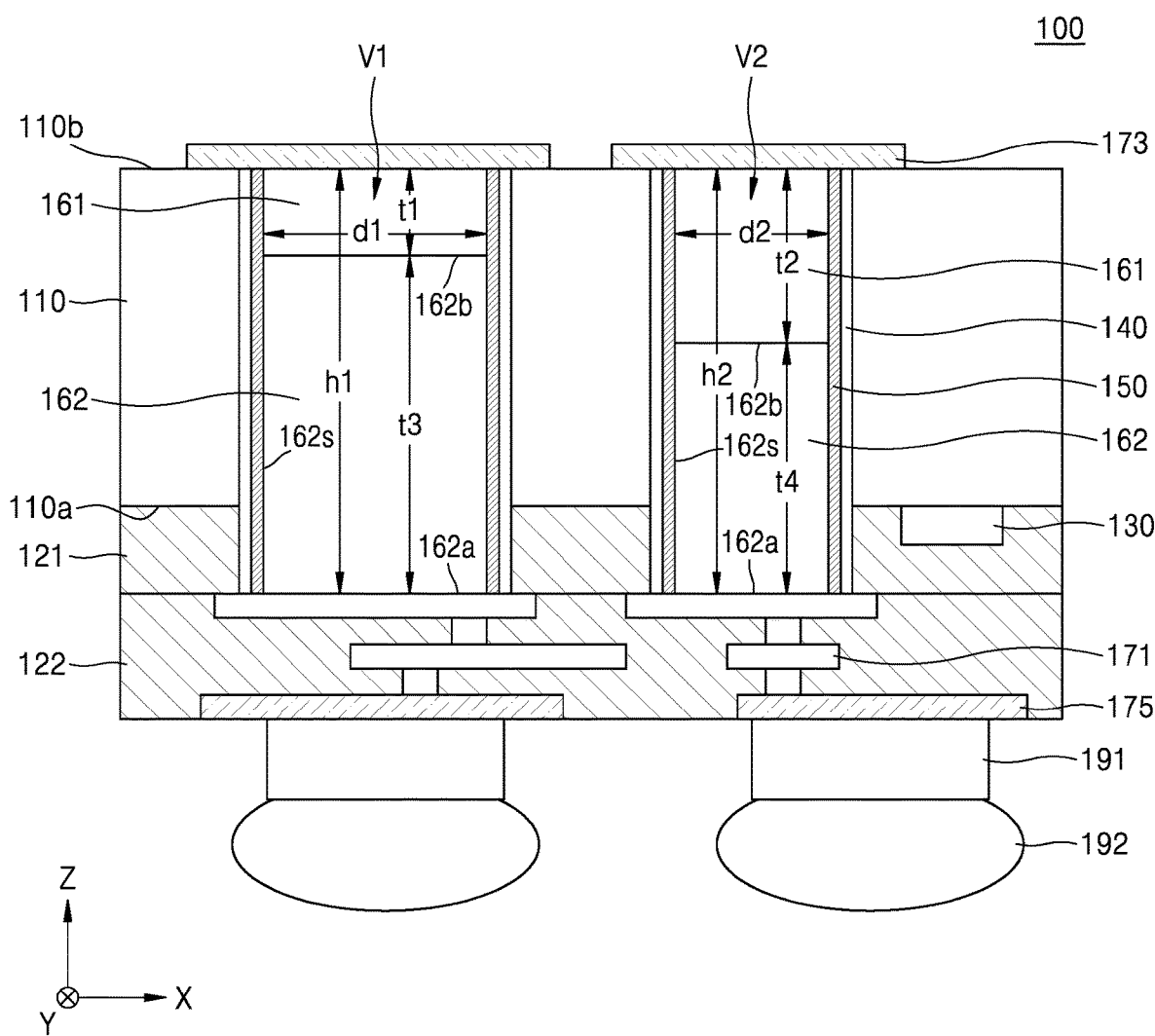
FIGS. 1 through 8 are cross-sectional views of semiconductor devices, according to example embodiments of the inventive concept.

The present disclosure now will be described more fully hereinafter with reference to the accompanying drawings, in which various embodiments are shown. In the drawings, like numbers refer to like elements throughout.

FIG. 1 is a cross-sectional view of a semiconductor device 100 according to an example embodiment of the inventive concept. The semiconductor device 100 according to the technical idea of the inventive concept may include a semiconductor chip (also referred to as a die). For example, the semiconductor device 100 may include a logic semiconductor chip, a memory semiconductor chip, an image sensor chip, or an interposer chip. The semiconductor device 100 may include a substrate 110, a first through substrate via V1, and a second through substrate via V2.

The substrate 110 may include a first surface 110a and a second surface 110b facing each other. The first surface 110a and the second surface 110b of the substrate 110 may be perpendicular to a vertical direction (Z direction). In the present specification, the term "$n^{th}$" (n is an arbitrary natural number) may be added ahead of a component name to distinguish components having the same name for convenience of description and may not mean an absolute order. Accordingly, surfaces referred to as a first surface and a second surface in a description of an embodiment or in a claim set may be referred to as a second surface and a first surface in a description of another embodiment or in another claim set. In addition, in the embodiment illustrated in FIG. 1, the first surface 110a and the second surface 110b may be referred to as a bottom surface and a top surface, respectively.

In the example embodiments, a vertical relationship may have a meaning only with reference to the drawing and may not represent an absolute orientation. For example, spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both orientations of above and below. The device may be otherwise oriented (rotated 90 degrees or at other orientations) and the spatially relative descriptors used herein interpreted accordingly.

The substrate 110 may include a semiconductor material such as a Group IV semiconductor material, a Group III-V semiconductor material, or a Group II-VI semiconductor material. The Group IV semiconductor material may include, for example, silicon (Si), germanium (Ge), or Si—Ge. The Group III-V semiconductor material may include, for example, gallium arsenide (GaAs), indium phosphorus (InP), gallium phosphorus (GaP), indium arsenic (InAs), indium antimony (InSb), or indium gallium arsenide (InGaAs). The Group II-VI semiconductor material may include, for example, zinc telluride (ZnTe), or cadmium sulfide (CdS). The substrate 110 may include a bulk wafer or an epitaxial layer.

Each of the first through substrate via V1 and the second through substrate via V2 may extend lengthwise in the vertical direction (Z direction). Each of the first through substrate via V1 and the second through substrate via V2 may at least partially penetrate through the substrate 110. In some embodiments, each of the first through substrate via V1 and the second through substrate via V2 may totally penetrate through the substrate 110. For example, each of the first through substrate via V1 and the second through substrate via V2 may extend from the first surface 110a to the second surface 110b of the substrate 110. In some embodiments, each of the first through substrate via V1 and the second through substrate via V2 may further penetrate through a first interlayer insulating layer 121. Unlike that illustrated in FIG. 1, in some embodiments, each of the first through substrate via V1 and the second through substrate via V2 may further penetrate through a second interlayer insulating layer 122.

The first through substrate via V1 and the second through substrate via V2 may have different dimensions from each other. For example, in some embodiments, a height h1 of the first through substrate via V1 may be the same as a height h2 of the second through substrate via V2, but a planar cross-sectional area of the first through substrate via V1 may be greater than a planar cross-sectional area of the second through substrate via V2. In the present specification, a planar cross-sectional area may denote an area of a planar cross-section. As used herein, the planar cross-section may refer to a cross-section parallel with an X-Y plane illustrated in FIG. 1. For example, the planar cross-section may be referred to as a cross-section perpendicular to the vertical direction illustrated as the Z direction in FIG. 1. In the example embodiments, a ratio of the planar cross-sectional area of the first through substrate via V1 to the planar cross-sectional area of the second through substrate via V2 may be about 1:0.01 to about 1:0.9, for example, about 1:0.1 to about 1:0.9, or for example, about 1:0.2 to about 1:0.9. When the difference in planar cross-sectional areas is too large, voids may be formed in the first through substrate via V1 and the second through substrate via V2. In addition, when the difference in the planar cross-sectional areas is too small, a beneficial effect obtained by forming the first and second through substrate vias V1 and V2 of different sizes or different aspect ratios may be negligible.

When the planar cross-section of each of the first through substrate via V1 and the second through substrate via V2 is circular, a diameter d1 of the planar cross-section of the first through substrate via V1 may be greater than a diameter d2 of the planar cross-section of the second through substrate via V2. A ratio of the diameter d1 of the planar cross-section of the first through substrate via V1 to the diameter d2 of the planar cross-section of the second through substrate via V2 may be about 1:0.1 to about 1:0.9, for example, about 1:0.3 to about 1:0.9, or for example, about 1:0.5 to about 1:0.9. Accordingly, an aspect ratio h1/d1 of the first through substrate via V1 may be less than an aspect ratio h2/d2 of the second through substrate via V2. A ratio of the aspect ratio h1/d1 of the first through substrate via V1 to the aspect ratio h2/d2 of the second through substrate via V2 may be about 0.1:1 to about 0.9:1, for example, about 0.3:1 to about 0.9:1, or for example, about 0.5:1 to about 0.9:1. In some embodiments, each of the diameter d1 of the first through substrate via V1 and the diameter d2 of the second through substrate via V2 may be in a range of about 0.1 µm to about 10 µm. In some embodiments, each of the height h1 of the first through substrate via V1 and the height h2 of the second through substrate via V2 may be in a range of about 5 µm to about 100 µm. In some embodiments, each of the aspect ratio h1/d1 of the first through substrate via V1 and the aspect ratio h2/d2 of the second through substrate via V2 may be in a range of about 2 to about 100, for example, about 5 to about 50.

In another embodiment, unlike that illustrated in FIG. 1, the first through substrate via V1 and the second through substrate via V2 may have the same planar cross-sectional area, but the height h1 of the first through substrate via V1 may be less than the height h2 of the second through substrate via V2. Accordingly, the aspect ratio h1/d1 of the first through substrate via V1 may be less than an aspect ratio h2/d2 of the second through substrate via V2.

In some embodiments, the first through substrate via V1 and the second through substrate via V2 may be used to transmit different kinds of signals. For example, the first through substrate via V1 may transmit a power signal and a data signal, while the second through substrate via V2 may transmit an address signal and a command signal. By differentiating the aspect ratios of the first through substrate via V1 and the second through substrate via V2, particular signals may be transmitted fast at a relatively low resistance by using the first through substrate vias V1 having a smaller aspect ratio, while the planar cross-sectional area (that is, an area of a cross-section perpendicular to Z direction) of the semiconductor device 100 may be reduced by using the second through substrate vias V2 having a greater aspect ratio.

Each of the first through substrate via V1 and the second through substrate via V2 may include a first conductive layer 161 and a second conductive layer 162. The first conductive layer 161 may be on the second conductive layer 162. In the present specification, that a component is on another component may mean that the component is in direct or indirect contact with the other component. Accordingly, at least one intermediate component may be further arranged between the component and the other component. In addition, that a component is on another component may not be limited to that the component is in direct or indirect contact with a top surface of the other component, and may mean that the component is in direct or indirect contact with any surface of the other component, for example, a top surface, a bottom surface, or a side surface. At least a portion of the second conductive layer 162 of each of the first through substrate via V1 and the second through substrate via V2 is in a bottom portion of each of the first through substrate via V1 and the second through substrate via V2, and at least a portion of the first conductive layer 161 of each of the first through substrate via V1 and the second through substrate via V2 may be in a top portion of each of the first through substrate via V1 and the second through substrate via V2. Accordingly, in the present embodiment, the second conductive layer 162 may be referred to as a bottom conductive layer and the first conductive layer 161 may be referred to as a top conductive layer.

The second conductive layer 162 of each of the first through substrate via V1 and the second through substrate via V2 may include a first surface 162a perpendicular to the vertical direction (Z direction), a second surface 162b facing the first surface 162a, and a side surface 162s extending between the first surface 162a and the second surface 162b. In the present embodiment, the first surface 162a and the second surface 162b of the second conductive layer 162 may be referred to as a bottom surface and a top surface of the second conductive layer 162, respectively. At least a portion of the first conductive layer 161 of each of the first through substrate via V1 and the second through substrate via V2 may be on the second surface 162b of the second conductive layer 162 of each of the first through substrate via V1 and the second through substrate via V2. In some embodiments, at least a portion of the bottom surface of the first conductive layer 161 of each of the first through substrate via V1 and the second through substrate via V2 may directly contact the second surface 162b of the second conductive layer 162 of each of the first through substrate via V1 and the second through substrate via V2.

A thickness t1 in the vertical direction (Z direction) of the first conductive layer 161 of the first through substrate via V1 may be less than a thickness t2 in the vertical direction (Z direction) of the first conductive layer 161 of the second through substrate via V2. For example, the thickness t1 in the vertical direction (Z direction) of the first conductive layer 161 of the first through substrate via V1 may be about 0.1 µm to about 20 µm, for example, about 1 µm to about 20 µm less than the thickness t2 in the vertical direction (Z direction) of the first conductive layer 161 of the second through substrate via V2. A thickness t3 in the vertical direction (Z direction) of the second conductive layer 162 of the first through substrate via V1 may be greater than a thickness t4 in the vertical direction (Z direction) of the second conductive layer 162 of the second through substrate via V2. For example, the thickness t3 in the vertical direction (Z direction) of the second conductive layer 162 of the first through substrate via V1 may be about 0.1 μm to about 20 μm, for example, about 1 μm to about 20 μm greater than the thickness t4 in the vertical direction (Z direction) of the second conductive layer 162 of the second through substrate via V2.

In some embodiments, the thickness t1 in the vertical direction (Z direction) of the first conductive layer 161 of the first through substrate via V1 may be less than the thickness t3 in the vertical direction (Z direction) of the second conductive layer 162 of the first through substrate via V1, and the thickness t2 in the vertical direction (Z direction) of the first conductive layer 161 of the second through substrate via V2 may be less than the thickness t4 in the vertical direction (Z direction) of the second conductive layer 162 of the second through substrate via V2. For example, the thickness t1 in the vertical direction (Z direction) of the first conductive layer 161 of the first through substrate via V1 may be about 1 μm to about 40 μm less than the thickness t3 in the vertical direction (Z direction) of the second conductive layer 162 of the first through substrate via V1, and the thickness t2 in the vertical direction (Z direction) of the first conductive layer 161 of the second through substrate via V2 may be about 1 μm to about 40 μm less than the thickness t4 in the vertical direction (Z direction) of the second conductive layer 162 of the second through substrate via V2.

The grain size of the first conductive layer 161 of the first through substrate via V1 may be different from that of the second conductive layer 162 of the first through substrate via V1. In addition, the grain size of the first conductive layer 161 of the second through substrate via V2 may be different from that of the second conductive layer 162 of the second through substrate via V2. In some embodiments, an average grain size of the second conductive layer 162 of the first through substrate via V1 may be greater than an average grain size of the first conductive layer 161 of the first through substrate via V1, and an average grain size of the second conductive layer 162 of the second through substrate via V2 may be greater than an average grain size of the first conductive layer 161 of the second through substrate via V2. For example, a ratio of the average grain size of the first conductive layer 161 to the average grain size of the second conductive layer 162 may range from about 0.001:1 to about 0.9:1, for example, from about 0.01:1 to about 0.9:1, or for example, about 0.1:1 to about 0.9:1. In this case, the thickness t1 in the vertical direction (Z direction) of the first conductive layer 161 of the first through substrate via V1 may be less than the thickness t3 in the vertical direction (Z direction) of the second conductive layer 162 of the first through substrate via V1. In another embodiment, the average grain size of the second conductive layer 162 of the first through substrate via V1 may be less than the average grain size of the first conductive layer 161 of the first through substrate via V1, and the average grain size of the second conductive layer 162 of the second through substrate via V2 may be less than the average grain size of the first conductive layer 161 of the second through substrate via V2. For example, the ratio of the average grain size of the first conductive layer 161 to the average grain size of the second conductive layer 162 may range from about 1:0.001 to about 1:0.9, for example, from about 1:0.01 to about 1:0.9, or for example, about 1:0.1 to about 1:0.9. In this case, the thickness t1 in the vertical direction (Z direction) of the first conductive layer 161 of the first through substrate via V1 may be greater than the thickness t3 in the vertical direction (Z direction) of the second conductive layer 162 of the first through substrate via V1. In some embodiments, the average grain size of the first conductive layer 161 may be about 1 μm to about 20 μm, and the average grain size of the second conductive layer 162 may be about 1 μm to about 5 μm.

In some embodiments, the average grain size of the first conductive layer 161 of the first through substrate via V1 may be substantially the same as the average grain size of the first conductive layer 161 of the second through substrate via V2. However, in other embodiments, the average grain size of the first conductive layer 161 of the first through substrate via V1 may be different from the average grain size of the first conductive layer 161 of the second through substrate via V2. In some embodiments, the average grain size of the second conductive layer 162 of the first through substrate via V1 may be substantially the same as the average grain size of the second conductive layer 162 of the second through substrate via V2. However, in other embodiments, the average grain size of the second conductive layer 162 of the first through substrate via V1 may be different from the average grain size of the second conductive layer 162 of the second through substrate via V2.

The first conductive layer 161 and the second conductive layer 162 may include copper (Cu), cobalt (Co), or a combination thereof, but are not limited thereto. In some embodiments, the first conductive layer 161 and the second conductive layer 162 may include the same material. The same material may include, for example, copper, tin, or both of them. In other embodiments, the material of the first conductive layer 161 may be different from that of the second conductive layer 162.

The first conductive layer 161 and the second conductive layer 162 may include layers formed by different process operations. For example, the first conductive layer 161 may be formed through a chemical vapor deposition (CVD) operation or a physical vapor deposition (PVD) operation, and subsequently a reflow operation, while the second conductive layer 162 may include layers formed by an electroplating process. Accordingly, other properties such as, for example, electrical conductivity and density of the first conductive layer 161 and the second conductive layer 162 may also be different from each other.

The semiconductor device 100 may further include a via insulating layer 140 between the first through substrate via V1 and the substrate 110, and the via insulation layer 140 between the second through substrate via V2 and the substrate 110. The via insulating layers 140 may electrically insulate the first through substrate via V1 and the second through substrate via V2 from the substrate 110. The via insulating layer 140 may include an insulating material such as silicon oxide, silicon nitride, or a combination thereof. The semiconductor device 100 may further include a barrier layer 150 between the first through substrate via V1 and the substrate 110, and the barrier layer 150 between the second through substrate via V2 and the substrate 110. The barrier layer 150 may be between the via insulating layer 140 and the first through substrate via V1, and between the via insulating layer 140 and the second through substrate via V2. For example, the barrier layer 150 may surround and contact the first through substrate via V1 and the second through substrate via V2, and the via insulating layer 140 may surround and contact the barrier layer 150. The via insulating layer 140 and the barrier layer 150 surrounding the first through substrate via V1 may extend the entire height h1 of the first through substrate via V1, and the via insulating layer 140 and the barrier layer 150 surrounding the second through substrate via V2 may extend the entire height h2 of the second through substrate via V2. The barrier layer 150 may include, for example, tantalum nitride (TaN), titanium nitride (TiN), or a combination thereof. In some embodiments, although not illustrated in FIG. 1, the barrier layer 150 may further include a portion between the first conductive layer 161 and a top pad 173.

A top surface of the via insulating layer 140, a top surface of the barrier layer 150, and top surfaces of the first through substrate via V1 and the second through substrate via V2 may be coplanar with one another. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

The semiconductor device 100 may further include the two top pads 173 respectively on top sides of the first through substrate via V1 and the second through substrate via V2, and the two bottom pads 175 respectively on bottom sides of the first through substrate via V1 and the second through substrate via V2. In some embodiments, the two top pads 173 may directly contact at least a portion of the second surface 110b of the substrate 110. Each top pad 173 may be illustrated in FIG. 1 as being in direct contact with the first through substrate via V1 and the second through substrate via V2, but in another embodiment, an additional wiring layer may be between the top pad 173 and each of the first through substrate via V1 and the second through substrate via V2. Each of the first through substrate via V1 and the second through substrate via V2 may be connected to the bottom pad 175 via a wiring 171. In another embodiment, unlike that illustrated in FIG. 1, each of the first through substrate via V1 and the second through substrate via V2 may be directly connected to each bottom pad 175 without the wirings 171.

The semiconductor device 100 may further include a bump 192 on the bottom pad 175. The bump 192 may include, for example, Sn, In, Bi, Sb, Cu, Ag, Au, Zn, Pb, or a combination thereof. In some embodiments, the semiconductor device 100 may further include a pillar 191 between the bump 192 and the bottom pad 175. The pillar 191 may include, for example, Ni, Cu, Pd, Pt, Au, or a combination thereof.

The semiconductor device 100 may further include an integrated circuit 130 formed on the first surface 110a of the substrate 110. In some embodiments, the integrated circuit 130 may directly contact the first surface 110a of the substrate 110. The integrated circuit 130 may include, for example, an integrated circuit of various functions, for example, a logic circuit, a memory circuit, or an image sensor circuit. The integrated circuit 130 may include, for example, a transistor, a diode, a capacitor, a resistor, or a combination thereof. The semiconductor device 100 may further include a first interlayer insulating layer 121 covering the first surface 110a of the substrate 110 and the integrated circuit 130. The first interlayer insulating layer 121 may include, for example, silicon oxide, silicon nitride, or a combination thereof.

The semiconductor device 100 may further include the wirings 171 on the first interlayer insulating layer 121. The wirings 171 may connect each of the first through substrate via V1 and the second through substrate via V2 to the bottom pad 175, and each of the first through substrate via V1 and the second through substrate via V2 to the integrated circuit 130. The semiconductor device 100 may further include the first interlayer insulating layer 121 and a second interlayer insulating layer 122 covering the wirings 171. The second interlayer insulating layer 122 may include, for example, silicon oxide, silicon nitride, or a combination thereof.

In some embodiments, the semiconductor device 100 may further include a protective layer (not illustrated) on the second interlayer insulating layer 122. The protective layer may protect the wirings 171 and the integrated circuit 130. The protective layer may include an inorganic material, an organic material, or a combination thereof. The inorganic material may include, for example, silicon oxide, silicon nitride, or a combination thereof. The protective layer may cover a portion of the bottom pad 175.

Figure 2:
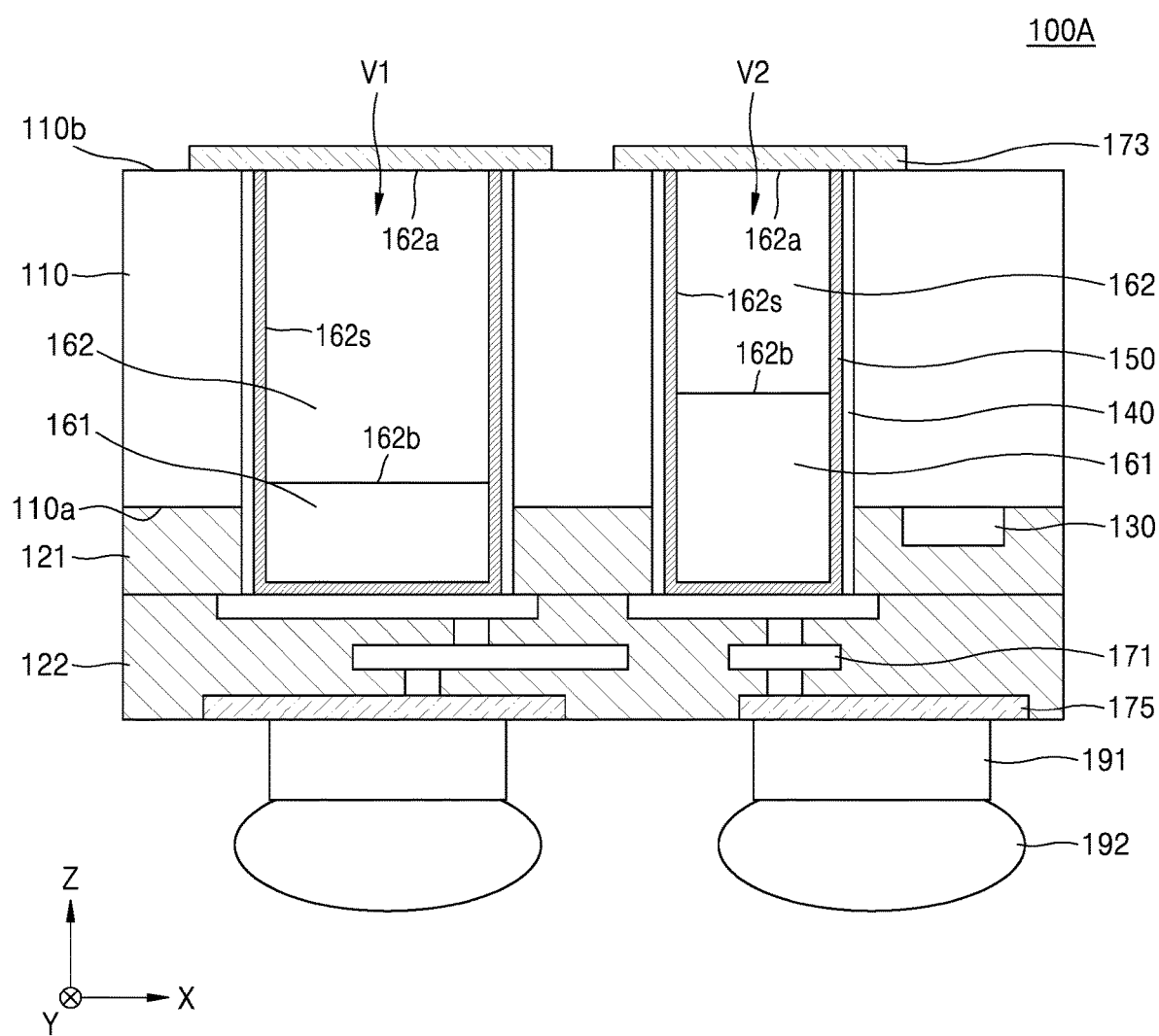

FIG. 2 is a cross-sectional view of a semiconductor device 100A according to an example embodiment of the inventive concept. Hereinafter, differences between the semiconductor device 100 illustrated in FIG. 1 and the semiconductor device 100A illustrated in FIG. 2 are described.

Referring to FIG. 2, at least a portion of the second conductive layer 162 of each of the first through substrate via V1 and the second through substrate via V2 may be in the top portion of each of the first through substrate via V1 and the second through substrate via V2, and at least a portion of the first conductive layer 161 of each of the first through substrate via V1 and the second through substrate via V2 may be in the bottom portion of each of the first through substrate via V1 and the second through substrate via V2. Accordingly, in the present embodiment, the second conductive layer 162 may be referred to as the top conductive layer and the first conductive layer 161 may be referred to as the bottom conductive layer.

In some embodiments, the barrier layer 150 may further include a portion on the bottom surface of each of the first through substrate vias V1 and the second through substrate vias V2. For example, the barrier layer 150 surrounding the first through substrate via V1 may extend the entire height h1 of the first through substrate via V1 and may further extend between the first conductive layer 161 of the first through substrate via V1 and the wiring 171, and the barrier layer 150 surrounding the second through substrate via V2 may extend the entire height h2 of the second through substrate via V2 and may further extend between the first conductive layer 161 of the second through substrate via V2 and the wiring 171. However, in other embodiments, the barrier layer 150 may be only on a side of each of the first through substrate via V1 and the second through substrate via V2, and may not include a portion on the bottom surface of each of the first through substrate via V1 and the second through substrate via V2.

As illustrated in FIG. 1, the first conductive layer 161 of each of the first through substrate via V1 and the second through substrate via V2 may be on the second surface 162b of the second conductive layer 162 of each of the first through substrate via V1 and the second through substrate via V2. In the present embodiment, the second surface 162b of the second conductive layer 162 may be referred to as a bottom surface of the second conductive layer 162, and the first surface 162a of the second conductive layer 162 may be referred to as a top surface of the second conductive layer 162. In some embodiments, at least a portion of the second surface 162b of the second conductive layer 162 of each of the first through substrate via V1 and the second through substrate via V2 may directly contact the top surface of the first conductive layer 161 of each of the first through substrate via V1 and the second through substrate via V2.

Figure 3:
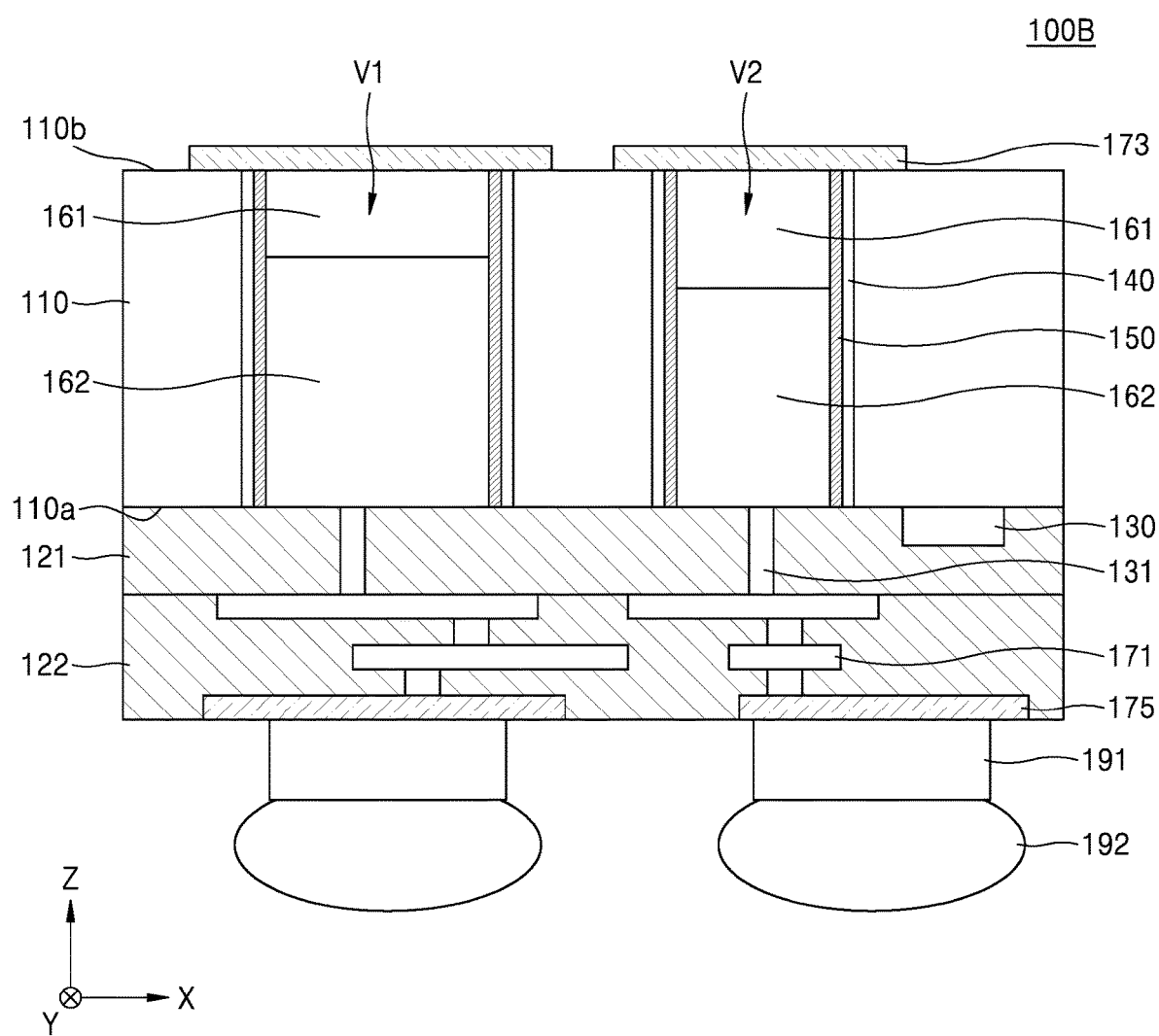

FIG. 3 is a cross-sectional view of a semiconductor device 100B according to an example embodiment of the inventive concept. Hereinafter, differences between the semiconductor device 100 illustrated in FIG. 1 and the semiconductor device 100B illustrated in FIG. 3 are described.

Referring to FIG. 3, each of the first through substrate via V1 and the second through substrate via V2 may not penetrate through the first interlayer insulating layer 121. For example, each of the first through substrate via V1 and the second through substrate via V2 may extend from the second surface 110b of the substrate 110 to the first surface 110a of the substrate 110, ending on the first surface 110a of the substrate 110. The semiconductor device 100B may further include conductive patterns 131 in the first interlayer insulating layer 121. The conductive patterns 131 may connect each of the first through substrate via V1 and the second through substrate via V2 to the wiring 171. For example, each of the first through substrate via V1 and the second through substrate via V2 may be connected to each corresponding bottom pad 175 via the conductive patterns 131 and the wiring 171.

Figure 4:
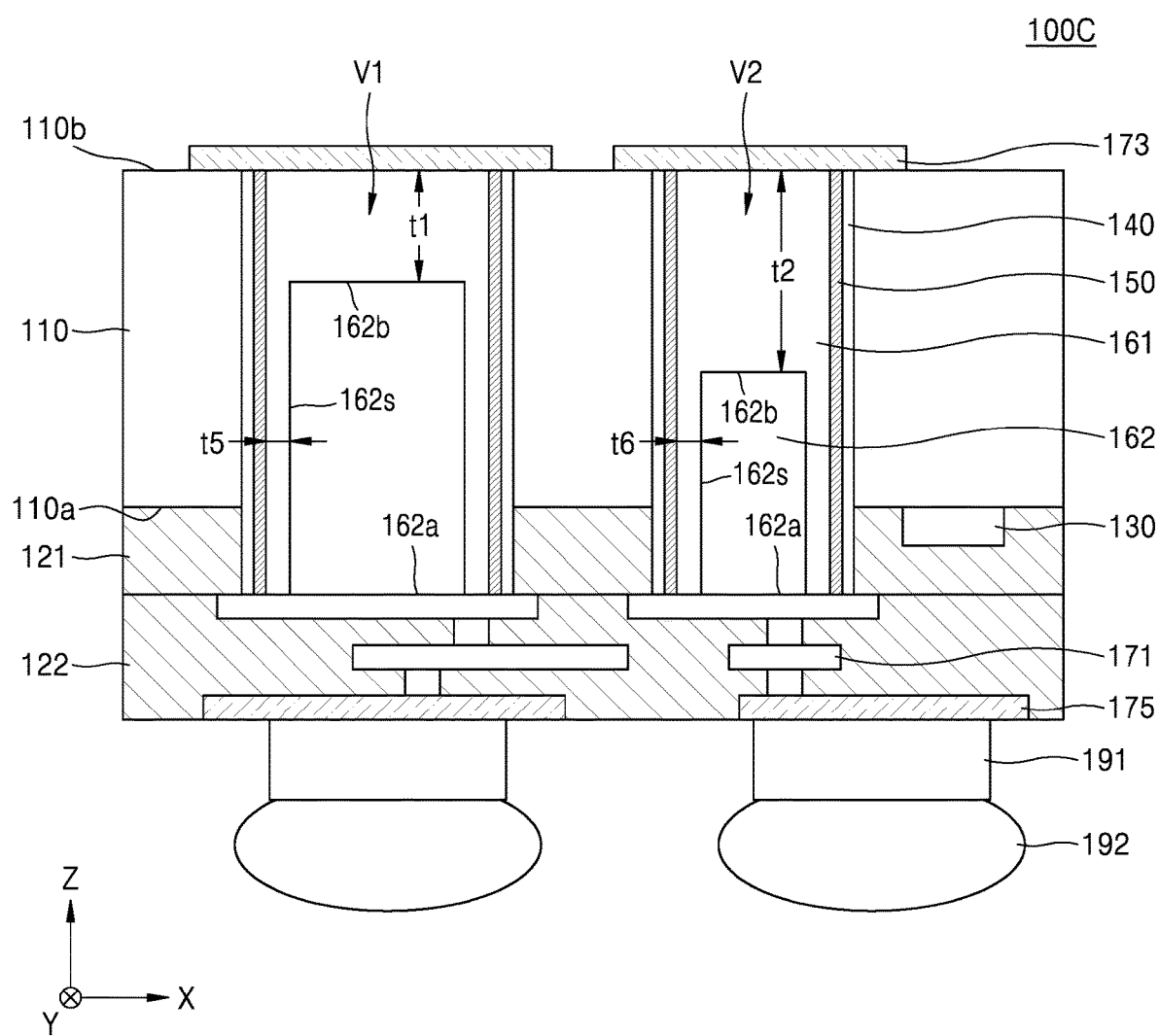

FIG. 4 is a cross-sectional view of a semiconductor device 100C according to an example embodiment of the inventive concept. Hereinafter, differences between the semiconductor device 100 illustrated in FIG. 1 and the semiconductor device 100C illustrated in FIG. 4 are described.

Referring to FIG. 4, the first conductive layer 161 of each of the first through substrate via V1 and the second through substrate via V2 may further include a portion on the side surface 162s of the second conductive layer 162 of each of the first through substrate via V1 and the second through substrate via V2. For example, the first conductive layer 161 of each of the first through substrate via V1 and the second through substrate via V2 may further include a portion on the sidewall of each of the first through substrate via V1 and the second through substrate via V2.

As shown in FIG. 4, the first conductive layer 161 of the first through substrate via V1 may have a thickness t1 in the vertical direction (Z direction) that reflects a thickness of the first conductive layer 161 between the second surface 162b of the second conductive layer 162 and the top surface of the first conductive layer 161, and a thickness t5 in the horizontal direction (X direction) that reflects a thickness of the first conductive layer 161 between the side surface 162s of the second conductive layer 162 and an outer surface of the first conductive layer 161. Similarly, the first conductive layer 161 of the second through substrate via V2 may have a thickness t2 in the vertical direction (Z direction) that reflects a thickness of the first conductive layer 161 between the second surface 162b of the second conductive layer 162 and the top surface of the first conductive layer 161, and a thickness t6 in the horizontal direction (X direction) that reflects a thickness of the first conductive layer 161 between the side surface 162s of the second conductive layer 162 and an outer surface of the first conductive layer 161.

A thickness t5 in the horizontal direction (X direction) of a portion of the first conductive layer 161 on the side surface 162s of the second conductive layer 162 of the first through substrate via V1 may be less than the thickness t1 in the vertical direction (Z direction) of a portion of the first conductive layer 161 on the second surface 162b of the second conductive layer 162 of the first through substrate via V1. For example, the thickness t5 in the horizontal direction (X direction) of a portion of the first conductive layer 161 on the sidewall portion of the first through substrate via V1 may be less than the thickness t1 in the vertical direction (Z direction) of a portion of the first conductive layer 161 in the top portion of the first through substrate via V1.

Similarly, a thickness t6 in the horizontal direction (X direction) of a portion of the first conductive layer 161 on the side surface 162s of the second conductive layer 162 of the second through substrate via V2 may be less than the thickness t2 in the vertical direction (Z direction) of a portion of the first conductive layer 161 on the second surface 162b of the second conductive layer 162 of the second through substrate via V2. For example, the thickness t6 in the horizontal direction (X direction) of a portion of the first conductive layer 161 on the sidewall portion of the second through substrate via V2 may be less than the thickness t2 in the vertical direction (Z direction) of a portion of the first conductive layer 161 in the top portion of the second through substrate via V2.

For example, the thickness t5 in the horizontal direction (X direction) of the portion of the first conductive layer 161 on the side surface 162s of the second conductive layer 162 of the first through substrate via V1 and the thickness t6 in the horizontal direction (X direction) of the portion of the first conductive layer 161 on the side surface 162s of the second conductive layer 162 of the second through substrate via V2 may be about 0 nm to about 1 µm, for example, about 0 nm to about 500 nm, for example, about 0 nm to about 200 nm, or for example, about 0 nm to about 100 nm. For example, the thickness t1 in the vertical direction (Z direction) of the portion of the first conductive layer 161 on the second surface 162b of the second conductive layer 162 of the first through substrate via V1 and the thickness t2 in the vertical direction (Z direction) of the portion of the first conductive layer 161 on the second surface 162b of the second conductive layer 162 of the second through substrate via V2 may be about 1 µm to about 20 µm, for example, about 2 µm to about 20 µm.

In some embodiments, an average grain size of the portion of the first conductive layer 161 on the side surface 162s of the second conductive layer 162 of the first through substrate via V1 may be less than an average grain size of the portion of the first conductive layer 161 on the second surface 162b of the second conductive layer 162 of the first through substrate via V1. For example, an average grain size of a portion of the first conductive layer 161 on the sidewall portion of the first through substrate via V1 may be less than an average grain size of a portion of the first conductive layer 161 in the top portion of the first through substrate via V1. Similarly, an average grain size of a portion of the first conductive layer 161 on the side surface 162s of the second conductive layer 162 of the second through substrate via V2 may be less than an average grain size of a portion of the first conductive layer 161 on the second surface 162b of the second conductive layer 162 of the second through substrate via V2. For example, an average grain size of a portion of the first conductive layer 161 on the sidewall portion of the second through substrate via V2 may be less than an average grain size of a portion of the first conductive layer 161 in the top portion of the second through substrate via V2. For example, the average grain size of the first conductive layer 161 in the portion on the sidewall portions of each of the first through substrate via V1 and the second through substrate via V2 may be about 0.01 µm to about 1 µm, for example, about 0.05 µm to about 0.5 µm.

In the present specification, the thickness t1 or t2 in the vertical direction (Z direction) of each first conductive layer 161 may be a thickness of a portion of each first conductive layer 161 on the second surface 162b of each second conductive layer 162 in the vertical direction (Z direction), and may not consider a portion of each first conductive layer 161 on the side surface 162s of each second conductive layer 162. In the present specification, an average grain size of each first conductive layer 161 may be referred to as an average grain size of a portion of each first conductive layer 161 on the second surface 162b of each second conductive layer 162, and the portion of each first conductive layer 161 on the side surface 162s of each second conductive layer 162 may not be considered.

Figure 5:
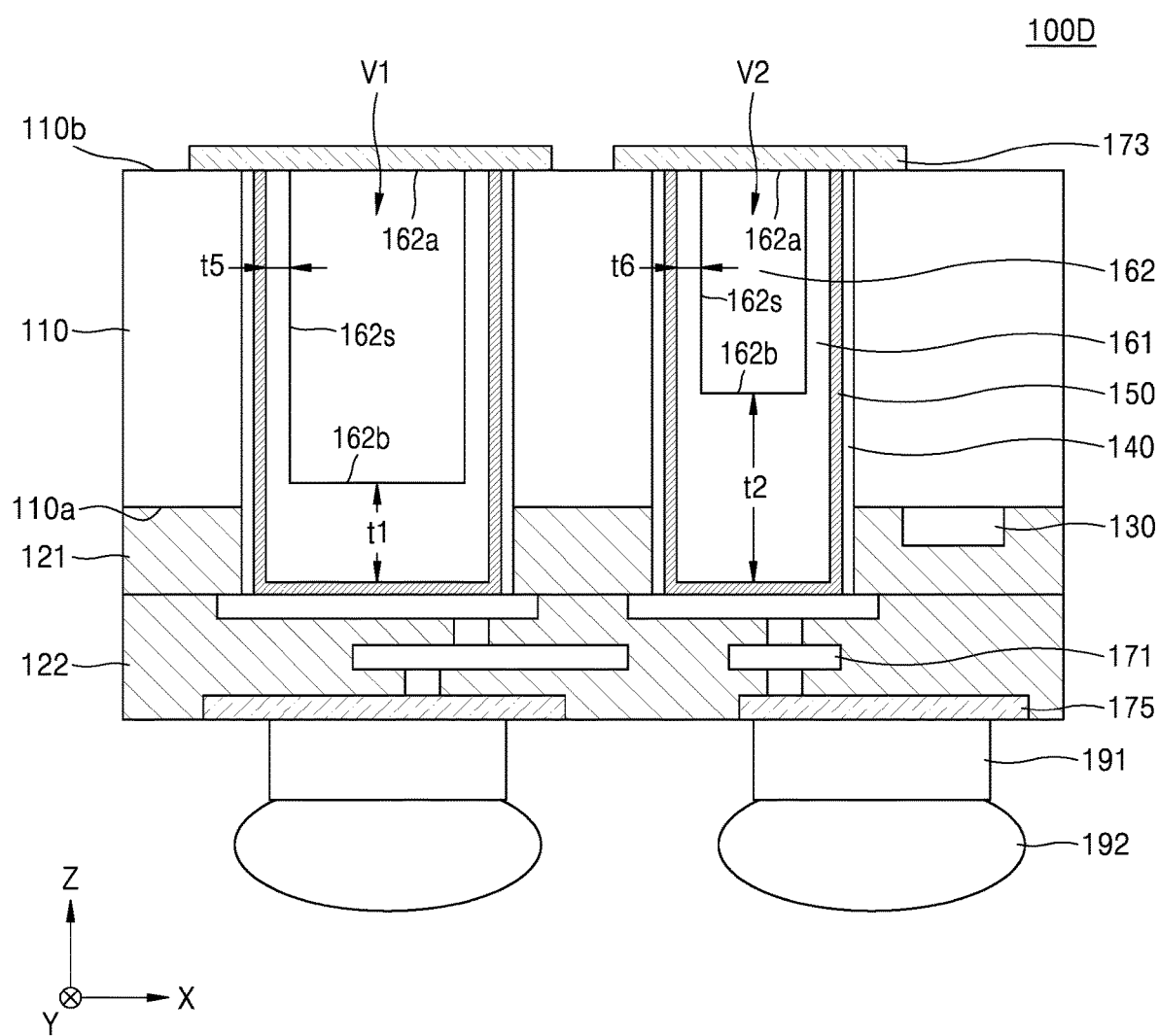

FIG. 5 is a cross-sectional view of a semiconductor device 100D according to an example embodiment of the inventive concept. Hereinafter, differences between the semiconductor device 100A illustrated in FIG. 2 and the semiconductor device 100D illustrated in FIG. 5 are described.

Referring to FIG. 5, the first conductive layer 161 of each of the first through substrate via V1 and the second through substrate via V2 may further include a portion on the sidewall of each of the first through substrate via V1 and the second through substrate via V2.

In FIG. 5, the first conductive layer 161 of the first through substrate via V1 may have a thickness t1 in the vertical direction (Z direction) that reflects a thickness of the first conductive layer 161 between the second surface 162b of the second conductive layer 162 and the bottom surface of the first conductive layer 161, and a thickness t5 in the horizontal direction (X direction) that reflects a thickness of the first conductive layer 161 between the side surface 162s of the second conductive layer 162 and an outer surface of the first conductive layer 161. Similarly, the first conductive layer 161 of the second through substrate via V2 may have a thickness t2 in the vertical direction (Z direction) that reflects a thickness of the first conductive layer 161 between the second surface 162b of the second conductive layer 162 and the bottom surface of the first conductive layer 161, and a thickness t6 in the horizontal direction (X direction) that reflects a thickness of the first conductive layer 161 between the side surface 162s of the second conductive layer 162 and an outer surface of the first conductive layer 161.

The thickness t5 in the horizontal direction (X direction) of a portion of the first conductive layer 161 on the sidewall portion of the first through substrate via V1 may be less than the thickness t1 in the vertical direction (Z direction) of a portion of the first conductive layer 161 in the bottom portion of the first through substrate via V1. Similarly, the thickness t6 in the horizontal direction (X direction) of a portion of the first conductive layer 161 on the sidewall portion of the second through substrate via V2 may be less than the thickness t2 in the vertical direction (Z direction) of a portion of the first conductive layer 161 in the bottom portion of the second through substrate via V2.

In some embodiments, an average grain size of a portion of the first conductive layer 161 on the sidewall portion of the first through substrate via V1 may be less than an average grain size of a portion of the first conductive layer 161 in the bottom portion of the first through substrate via V1. Similarly, an average grain size of a portion of the first conductive layer 161 on the sidewall portion of the second through substrate via V2 may be less than an average grain size of a portion of the first conductive layer 161 in the bottom portion of the second through substrate via V2.

Figure 6:
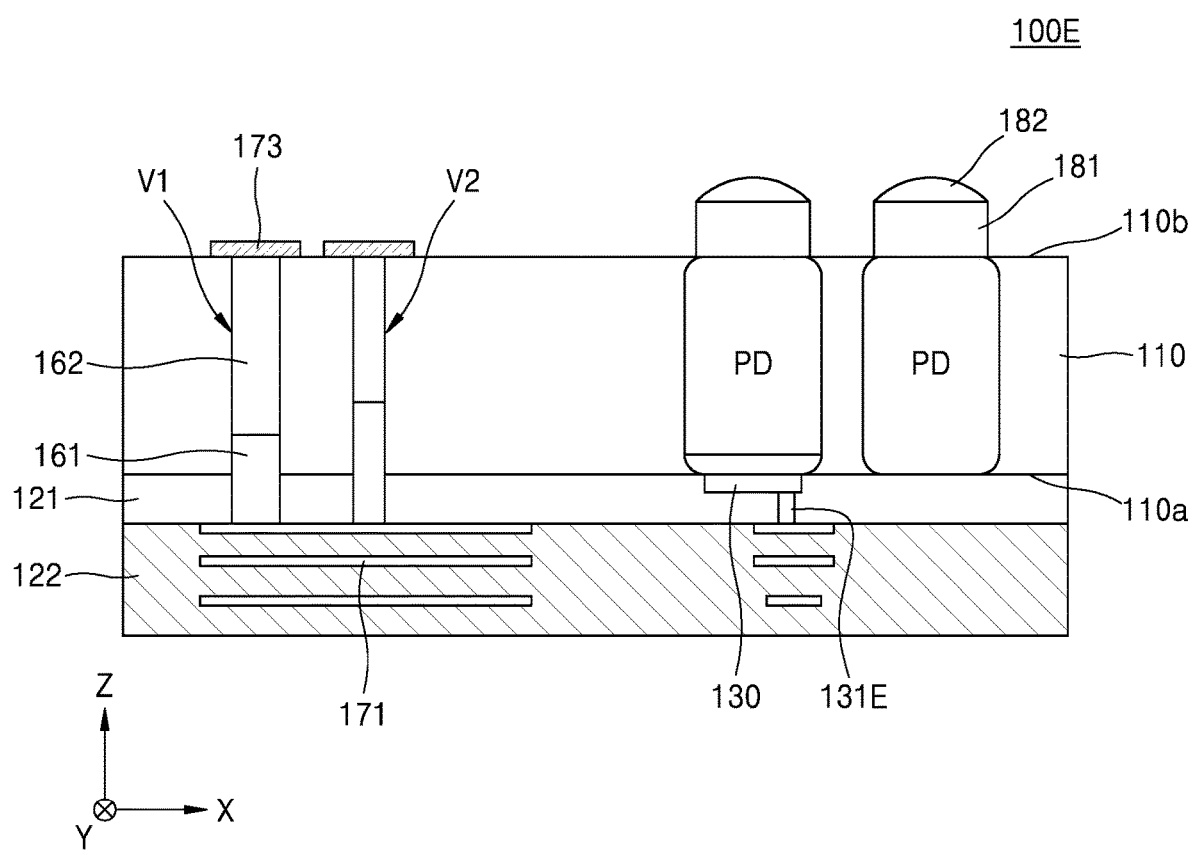

FIG. 6 is a cross-sectional view of a semiconductor device 100E according to an example embodiment of the inventive concept. Hereinafter, differences between the semiconductor device 100A illustrated in FIG. 2 and the semiconductor device 100E illustrated in FIG. 6 are described.

The semiconductor device 100E may further include photodiodes PD formed in the substrate 110, color filters 181 on the second surface 110b of the substrate 110, and micro lenses 182 on the color filters 181. The photodiodes PD may be connected to the integrated circuit 130 on the first surface 110a of the substrate 110. The integrated circuit 130 may be connected to the wiring 171 via conductive patterns 131E in the first interlayer insulating layer 121. The top pad 173 may be connected to the bump 192 or the wiring 171. The semiconductor device 100E may not include the bottom pad 175 on the second interlayer insulating layer 122.

Figure 7:
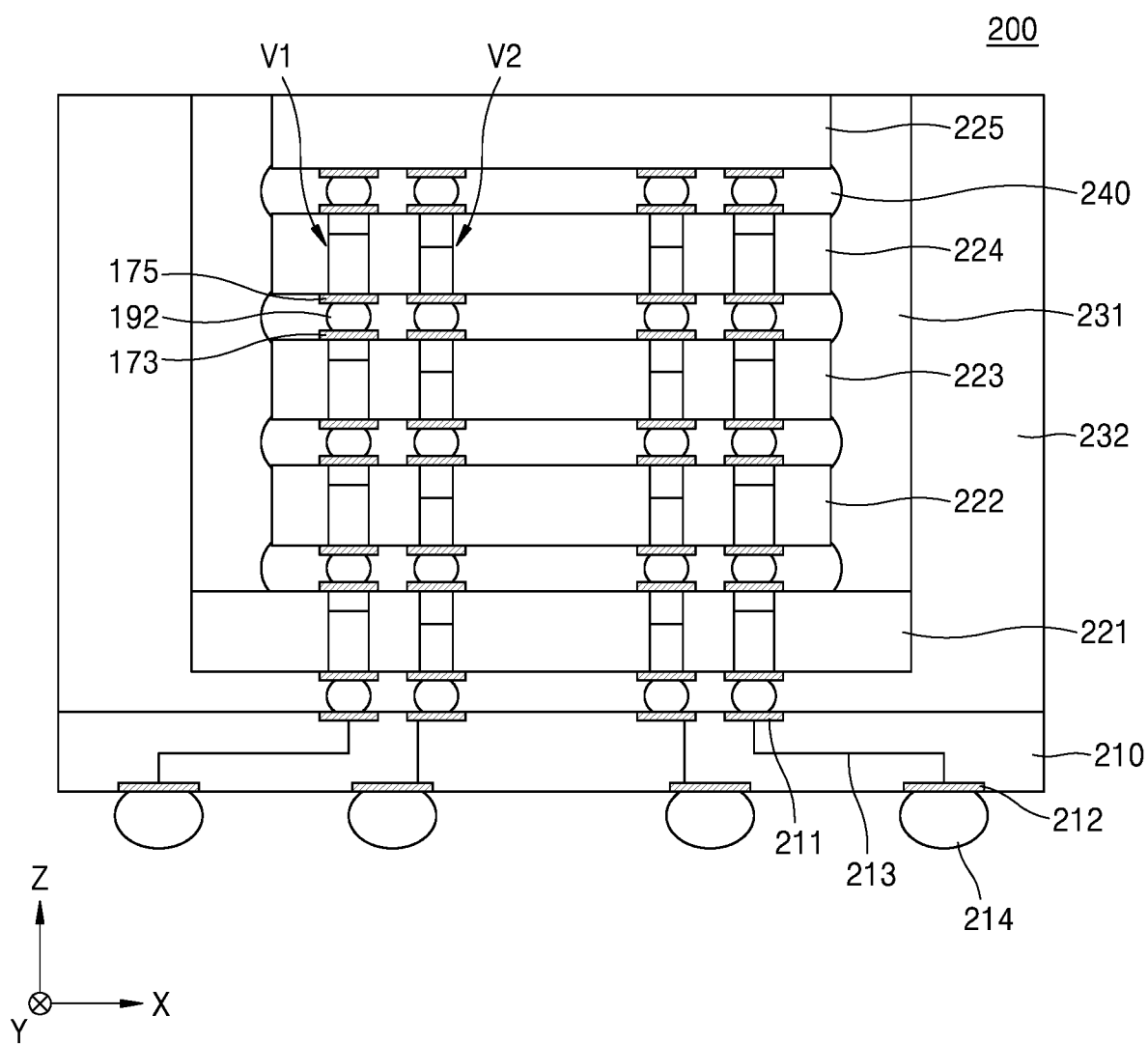

FIG. 7 is a cross-sectional view of a semiconductor device 200 according to an example embodiment of the inventive concept.

Referring to FIG. 7, the semiconductor device 200 may include a semiconductor package. The semiconductor device 200 may include, for example, a high bandwidth memory (HBM) package, but is not limited thereto. The semiconductor device 200 may include a package substrate 210, external connection terminals 214 on a bottom surface of the package substrate 210, and a plurality of semiconductor chips 221 through 225 on a top surface of the package substrate 210. Although FIG. 6 illustrates that the semiconductor device 200 includes five semiconductor chips 221 through 225, the semiconductor device 200 may include more or less than five semiconductor chips 221 through 225. For example, the semiconductor device 200 may include nine semiconductor chips.

The package substrate 210 may be, for example, a printed circuit board (PCB). The package substrate 210 may include a body, top pads 211 on a top surface of the body, bottom pads 212 on a bottom surface of the body, and conductive patterns 213 connecting the top pads 211 to the bottom pads 212. The external connection terminals 214 may be on the bottom pads 212 of the package substrate 210.

At least one of the plurality of semiconductor chips 221 through 225 may include one of the semiconductor devices 100 and 100A through 100D described with reference to FIGS. 1 through 5. FIG. 7 illustrates that the fifth semiconductor chip 225 does not include the first through substrate via V1 and the second through substrate via V2. However, in some embodiments, the fifth semiconductor chip 225 may also include one of the semiconductor devices 100 and 100A through 100D described with reference to FIGS. 1 through 5. In some embodiments, the first semiconductor chip 221 may include a logic semiconductor chip, and may also be referred to as a buffer chip or a base chip. The second through fifth semiconductor chips 222 through 225 may include memory chips. The second through fifth semiconductor chips 222 through 225 may include dynamic random access memory (RAM). The second through fifth semiconductor chips 222 through 225 may be stacked in the vertical direction (Z direction).

The bumps 192 may connect the top pad 211 of the package substrate 210 to the bottom pad 175 of the first semiconductor chip 221, and the top pad 173 of a bottom semiconductor chip to the bottom pad 175 of a top semiconductor chip. The first through substrate vias V1 of the semiconductor chips 221 through 224 may be connected to each other, and the second through substrate vias V2 of the semiconductor chips 221 through 224 may be connected to each other. In some embodiments, the first through substrate via V1 of the semiconductor chips 221 through 224 may have the same aspect ratio, and the second through substrate vias V2 of the semiconductor chips 221 through 224 may have the same aspect ratio. In some embodiments, the first through substrate vias V1 of the semiconductor chips 221 through 224 may have different aspect ratios from each other, and the second through substrate vias V2 of the semiconductor chips 221 through 224 may have different aspect ratios from each other.

In some embodiments, the semiconductor device 200 may further include a chip bonding layer 240 between each of the semiconductor chips 221 through 225. In some embodiments, the semiconductor device 200 may further include an inner sealing layer 231 that covers a at least a portion of top surface of the first semiconductor chip 221 and side surfaces of the second through fifth semiconductor chips 222 through 225. In some embodiments, the semiconductor device 200 may further include an outer sealing layer 232 that covers the top surface of the package substrate 210 and a side surface of the first semiconductor chip 221. The outer sealing layer 232 may further cover a side surface of the inner sealing layer 231.

In some embodiments, the semiconductor device 200 may further include an interposer chip (not illustrated) between the package substrate 210 and the first semiconductor chip 221. The interposer chip (not illustrated) may connect the first semiconductor chip 221 to the package substrate 210.

Figure 8:
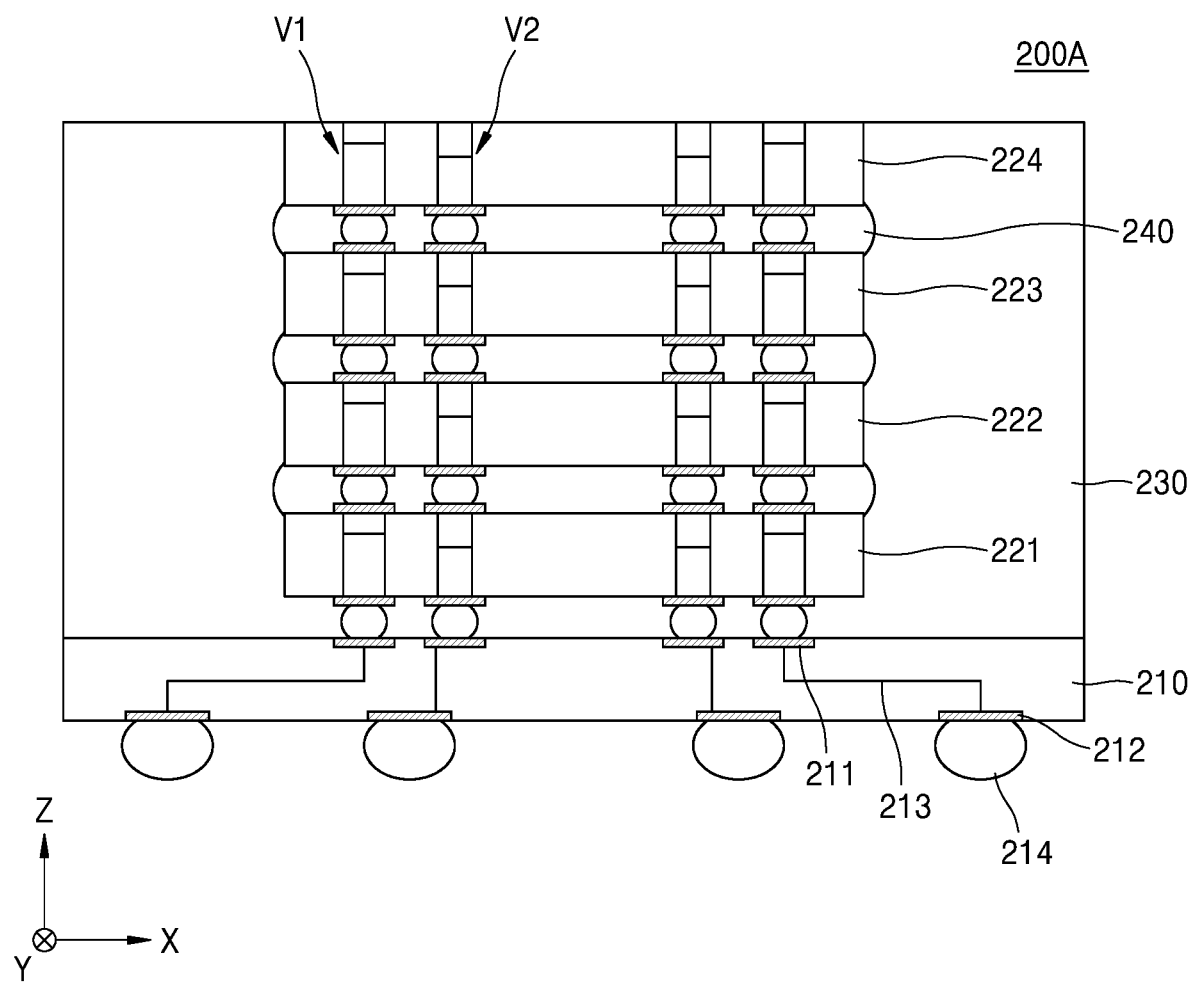

FIG. 8 is a cross-sectional view illustrating a semiconductor device 200A according to an example embodiment. Hereinafter, differences between the semiconductor device 200 illustrated in FIG. 7 and the semiconductor device 200A illustrated in FIG. 8 are described.

Referring to FIG. 8, the semiconductor device 200A may include the package substrate 210, the external connection terminals 214 on the bottom surface of the package substrate 210, and the first through fourth semiconductor chips 221 through 224 on the top surface of the package substrate 210. In some embodiments, all of the first through fourth semiconductor chips 221 through 224 may include memory chips. The first semiconductor chip 221 may also be referred to as a master chip, and the second through fourth semiconductor chips 222 through 224 may also be referred to as slave chips. The semiconductor device 200A may further include a sealing layer 230 that covers sidewalls of the first through fourth semiconductor chips 221 through 224 and the top surface of the package substrate 210.

FIGS. 9A through 9L are cross-sectional views illustrating a method of manufacturing a semiconductor device, according to example embodiments of the inventive concept.

Figure 9A:
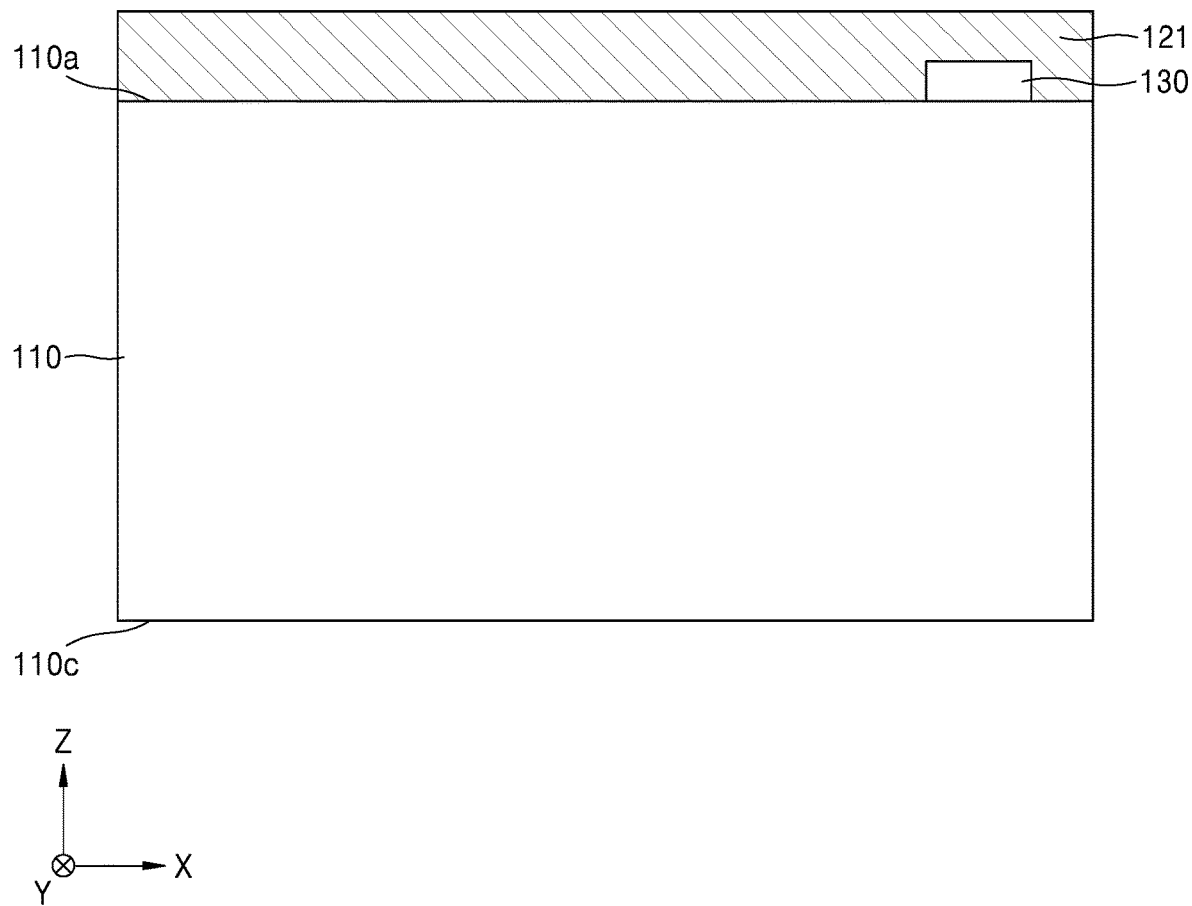
FIGS. 9A through 9L are cross-sectional views illustrating a method of manufacturing a semiconductor device, according to example embodiments of the inventive concept.

Referring to FIG. 9A, the substrate 110 including the first surface 110a and a third surface 110c facing each other may be provided. The integrated circuit 130 and the first interlayer insulating layer 121 may be formed on the first surface 110a of the substrate 110. A forming operation of the integrated circuit 130 and the first interlayer insulating layer 121 may be referred to as a front end of line (FEOL) operation.

Figure 9B:
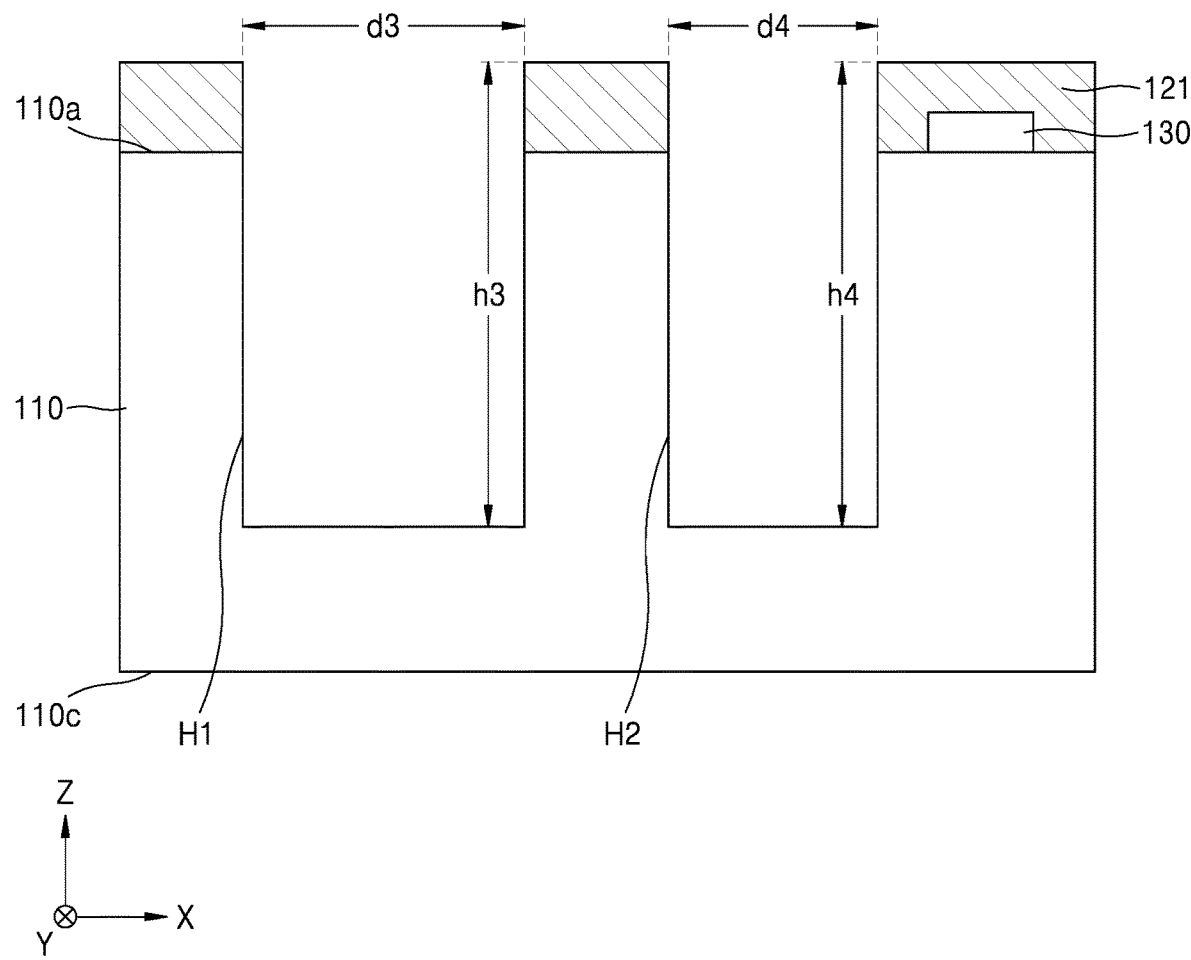

Referring to FIG. 9B, the first hole H1 and the second hole H2 may be formed in the substrate 110. Each of the first hole H1 and the second hole H2 may extend from the first surface 110a of the substrate 110 toward the third surface 110c of the substrate 110. In some embodiments, each of the first hole H1 and the second hole H2 may further penetrate through the first interlayer insulating layer 121. The first hole H1 may have a first aspect ratio (h3/d3) and the second hole H2 may have a second aspect ratio (h4/d4) greater than the first aspect ratio (h3/d3). In some embodiments, for example, a depth h3 of the first hole H1 may be equal to a depth h4 of the second hole H2, while a planar cross-sectional area of the first hole H1 is greater than that of the second hole H2, and a diameter d3 of the first hole H1 is greater than a diameter d4 of the second hole H2.

Figure 9C:
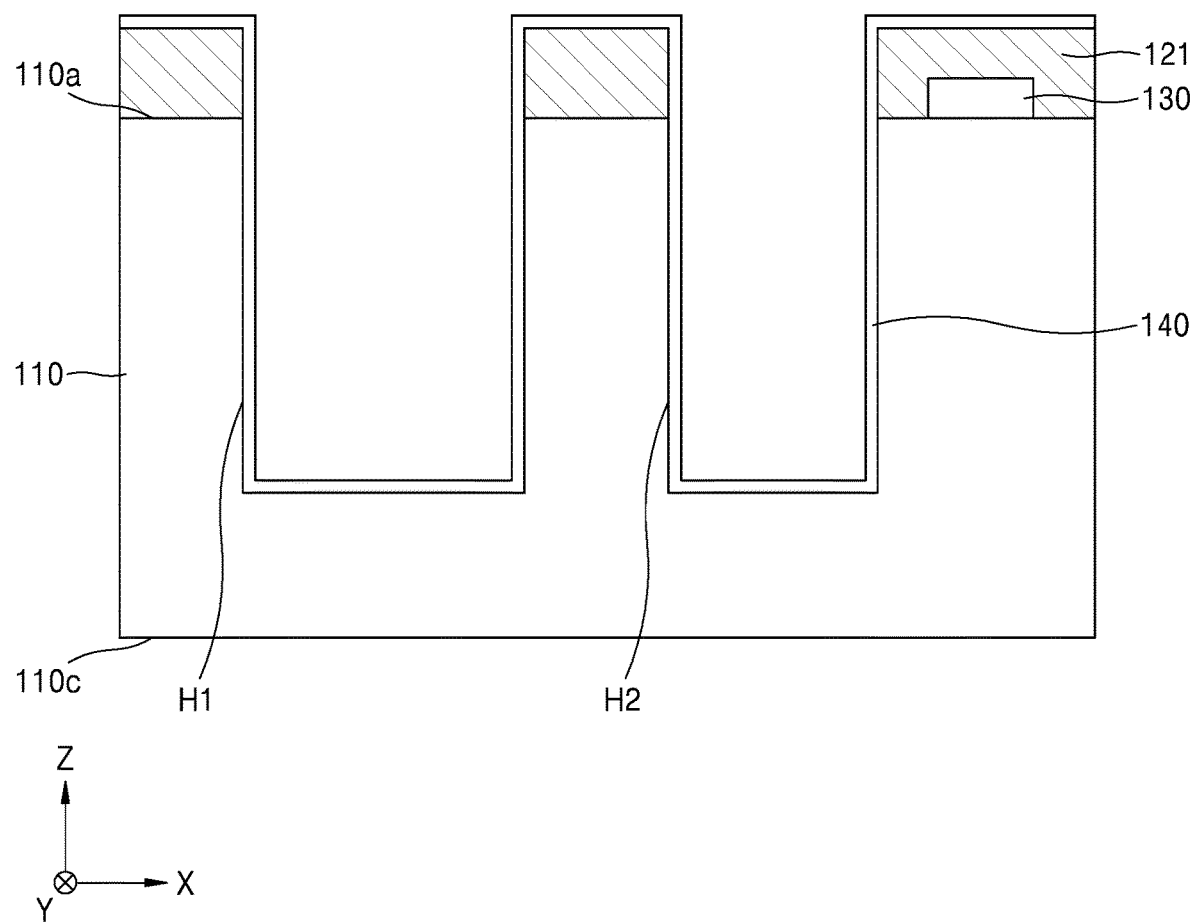

Referring to FIG. 9C, the via insulation layer 140 may be formed on the sidewall and the bottom of each of the first hole H1 and the second hole H2. In some embodiments, the via insulation layer 140 may be further formed on the first surface 110a of the substrate 110, e.g., on the first interlayer insulating layer 121. The via insulating layer 140 may be formed by, for example, thermal oxidation, atomic layer deposition (ALD), physical vapor deposition (PVD), chemical vapor deposition (CVD), or a combination thereof.

Figure 9D:
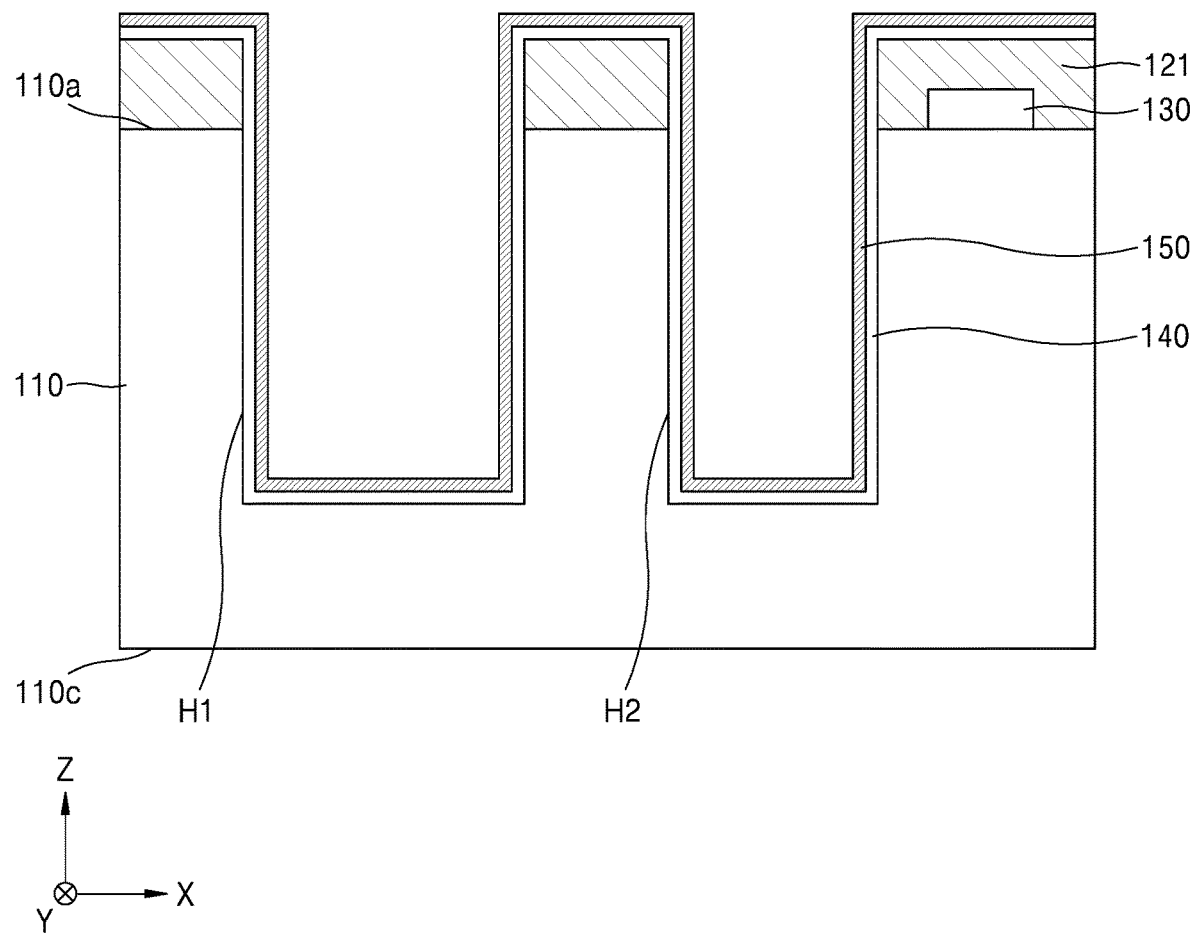

Referring to FIG. 9D, the barrier layer 150 may be formed on the via insulating layer 140. The barrier layer 150 may be formed by, for example, ALD, PVD, CVD, or a combination thereof.

Figure 9E:
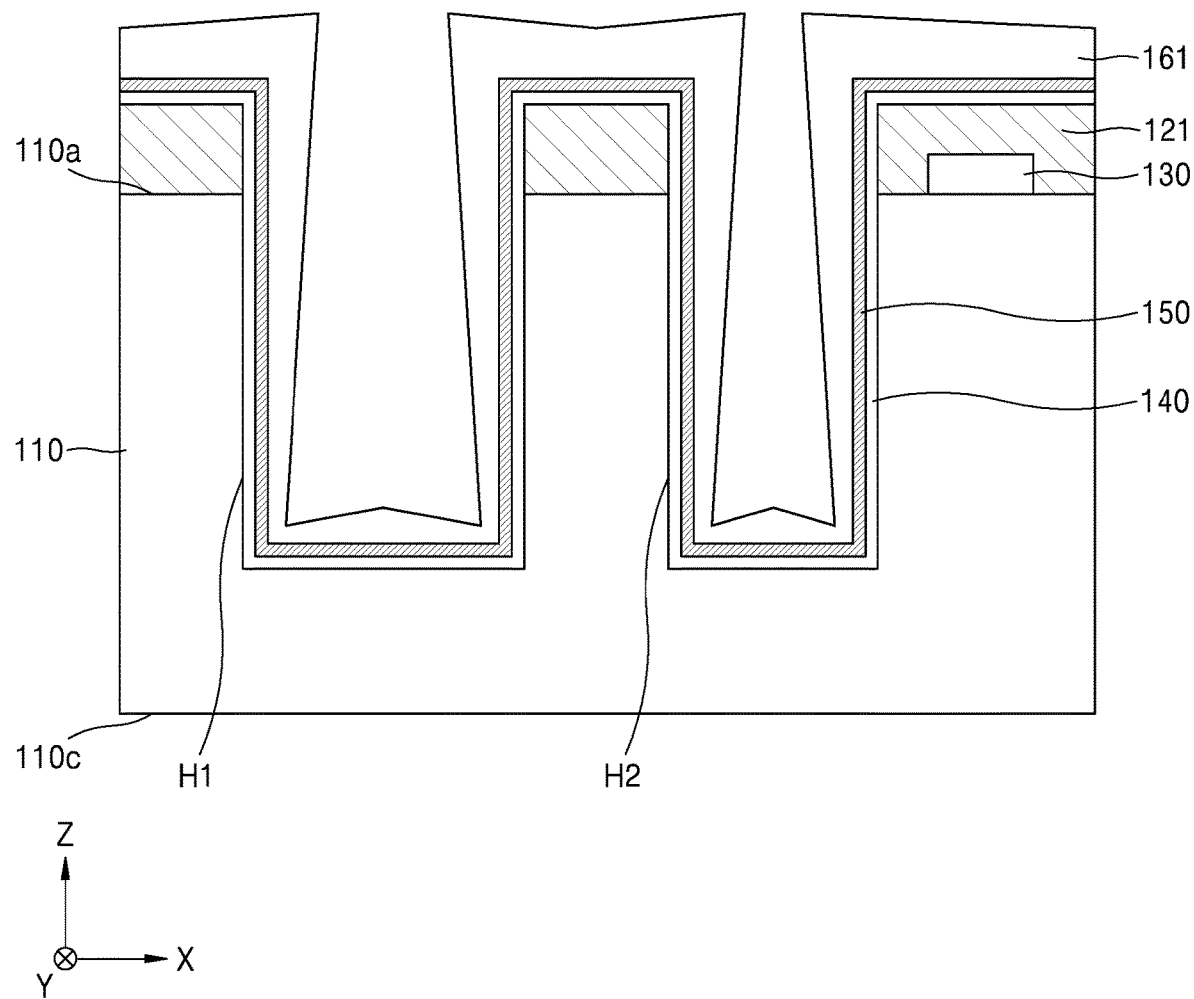

Referring to FIG. 9E, the first conductive layer 161 may be formed on the barrier layer 150, directly contacting the barrier layer 150. The first conductive layer 161 may be formed on the first surface 110a of the substrate 110, as well as in the first hole H1 and in the second hole H2. For example, the first conductive layer 161 may be formed on the first surface 110a of the substrate 110, and on the sidewall and the bottom of each of the first hole H1 and the second hole H2. The thickness of the portion of the first conductive layer 161 formed on the first surface 110a of the substrate 110 may be greater than the thickness of the portion of the first conductive layer 161 formed on the sidewall and the bottom of each of the first hole H1 and the second hole H2. The first conductive layer 161 may be formed by, for example, CVD, PVD, or a combination thereof.

Figure 9F:
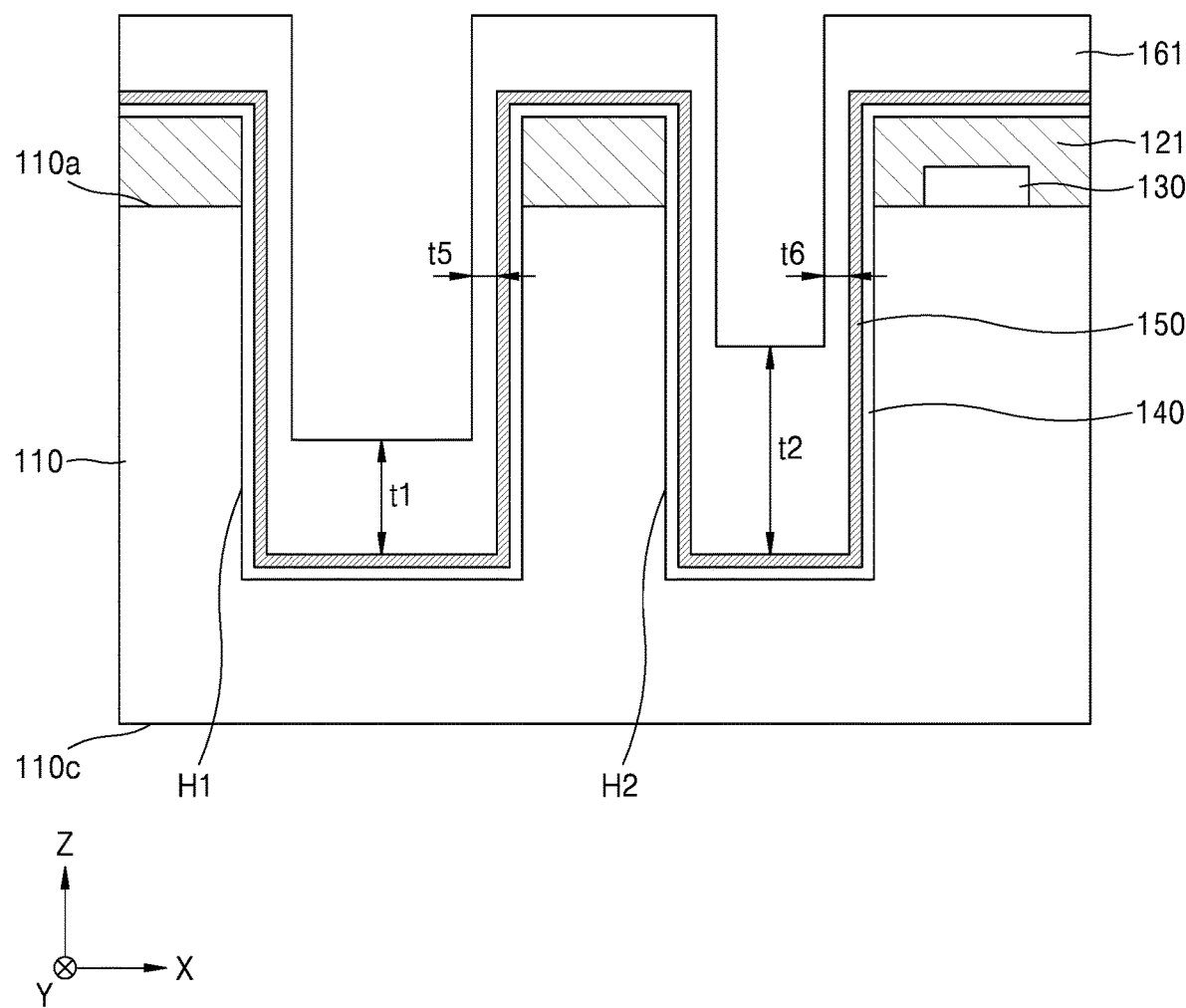

Referring to FIG. 9F, the first conductive layer 161 may be reflowed. Thermal annealing may be used to reflow the first conductive layer 161. For example, the first conductive layer 161 may be annealed in a vacuum chamber at a temperature of about 150° C. to about 600° C. for about 1 minute to about 1 hour, but the conditions are not limited thereto. The annealing may be performed, for example, in an atmosphere of hydrogen, oxygen, nitrogen, argon, or a mixture thereof. In some embodiments, plasma may be additionally used to reflow the first conductive layer 161. In some embodiments, a grain size of the first conductive layer 161 may grow during the reflow process.

During the reflow process, at least some of the portions of the first conductive layer 161 on the first surface 110a of the substrate 110 and on the sidewall of each of the first hole H1 and the second hole H2 may move to a bottom portion of each of the first hole H1 and the second hole H2. Thus, during the reflow process, the thickness t1 in the vertical direction (Z direction) of the portion of the first conductive layer 161 on the bottom of the first hole H1, and the thickness t2 in the vertical direction (Z direction) of the portion of the first conductive layer 161 on the bottom of the second hole H2 may be increased. The thickness t2 in the vertical direction (Z direction) of the portion of the first conductive layer 161 on the bottom of the second hole H2 may be increased more than the thickness t1 in the vertical direction (Z direction) of the portion of the first conductive layer 161 on the bottom of the first hole H1. For example, volumes of the first conductive layer 161 that move from the first surface 110a of the substrate 110 to the bottom portions of the first hole H1 and the second hole H2 per hour may be proportional to the diameters d1 and d2 of the first hole H1 and the second hole H2, respectively, while changes in the thicknesses t1 and t2 in the vertical direction (Z direction) per volume change is proportional to a reciprocals of squares of the diameters d1 and d2 of the first hole H1 and the second hole H2, respectively. Thus, the changes of the thicknesses t1 and t2 in the vertical direction (Z direction) per hour may be proportional to the reciprocals of the diameters d1 and d2 of the first hole H1 and the second hole H2, respectively, but are not limited thereto. After the reflow process, the thickness t2 in the vertical direction (Z direction) of the portion of the first conductive layer 161 on the bottom of the second hole H2 may be greater than the thickness t1 in the vertical direction (Z direction) of the portion of the first conductive layer 161 on the bottom of the first hole H1.

Portions of the first conductive layer 161 may flow from the first surface 110a of the substrate 110 down to the bottom of the first hole H1 and the second hole H2 along the sidewalls of the first hole H1 and the second hole H2, respectively. Thus, after the reflow process, the thickness t1 in the vertical direction (Z direction) of the portion of the first conductive layer 161 on the bottom of the first hole H1 may be greater than the thickness t5 in the horizontal direction (X direction) of the portion of the first conductive layer 161 on the sidewall of the first hole H1. In some embodiments, the thickness t5 in the horizontal direction (X direction) of the portion of the first conductive layer 161 on the sidewall of the first hole H1 may be about 0. For example, the portion of the first conductive layer 161 on the sidewall of the first hole H1 may move completely to the bottom portion of the first hole H1. In addition, after the reflow process, the thickness t2 in the vertical direction (Z direction) of the portion of the first conductive layer 161 on the bottom of the second hole H2 may be greater than the thickness t6 in the horizontal direction (X direction) of the portion of the first conductive layer 161 on the sidewall of the second hole H2. In some embodiments, the thickness t6 in the horizontal direction (X direction) of the portion of the first conductive layer 161 on the sidewall of the second hole H2 may be about 0. For example, the portion of the first conductive layer 161 on the sidewall of the second hole H2 may move completely to the bottom portion of the second hole H2.

The grains of the first conductive layer 161 may be grown by the reflow process. However, grain growth of portions of the first conductive layer 161 on the sidewalls of the first hole H1 and the second holes H2 may be limited by the thicknesses t5 and t6 in the horizontal direction (X direction) of the portions of the first conductive layers 161 on the sidewalls of the first hole H1 and the second hole H2, respectively. For example, as the average grain size of the portions of the first conductive layer 161 on the sidewalls of the first hole H1 and the second hole H2 approaches the thicknesses t5 and t6 in the horizontal direction (X direction) of the portions of the first conductive layer 161 on the sidewalls of the first hole H1 and the second hole H2, respectively, the grain growth of the portions of the first conductive layer 161 on the sidewalls of the first hole H1 and the second hole H2 may be limited. Thus, in some embodiments, after the reflow process is completed, the average grain size of the portion of the first conductive layer 161 on the sidewall of the first hole H1 may be less than the average grain size of the portion of the first conductive layer 161 on the bottom of the first hole H1, and after the reflow process is completed, the average grain size of the portion of the first conductive layer 161 on the sidewall of the second hole H2 may be less than the average grain size of the portion of the first conductive layer 161 on the bottom of the second hole H2.

Figure 9G:
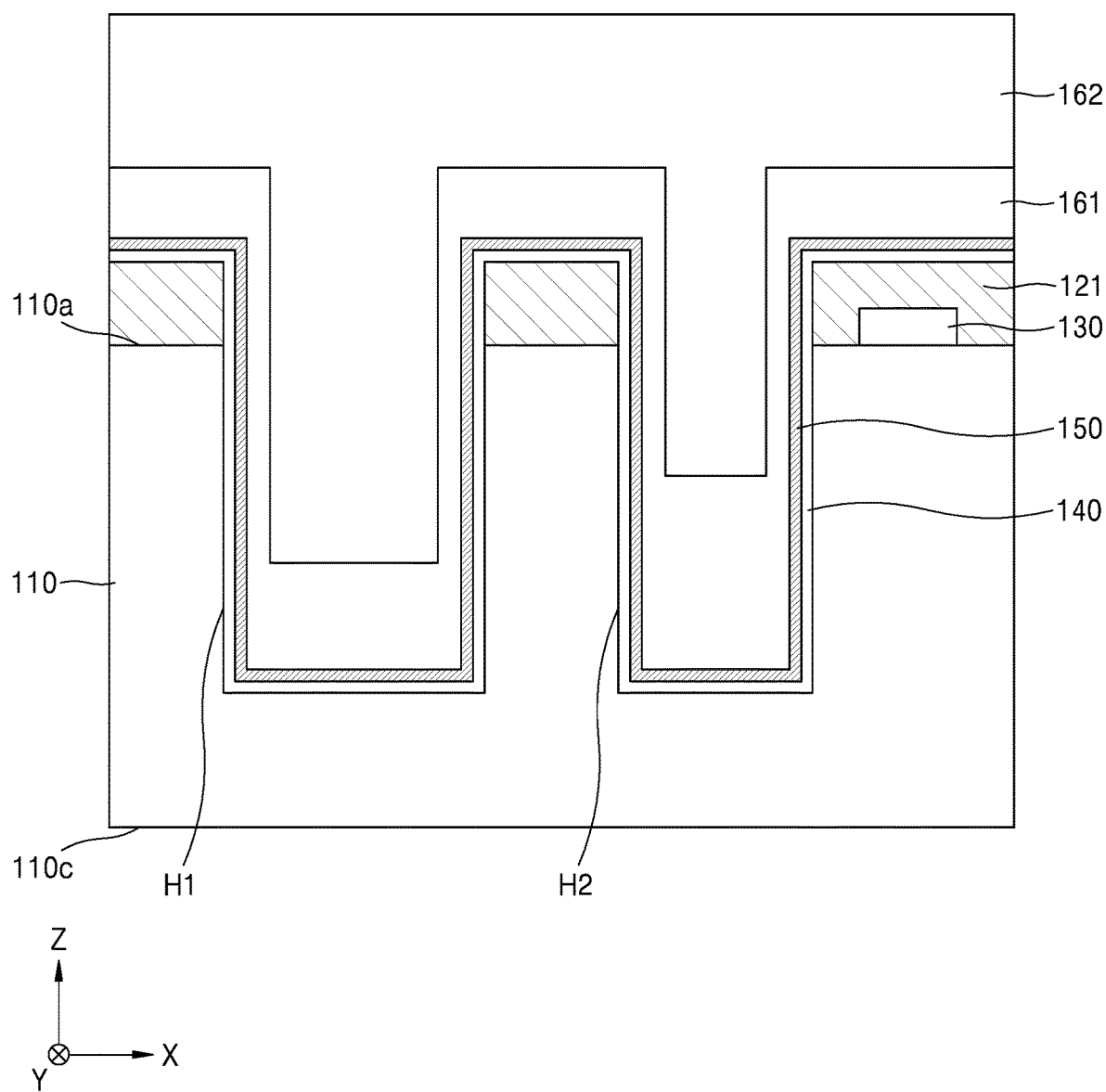

Referring to FIG. 9G, the second conductive layer 162 may be formed on the first conductive layer 161. The second conductive layer 162 may fill a remaining portion of each of the first hole H1 and the second hole H2. By reflowing the first conductive layer 161, the bottom portion of each of the first hole H1 and the second hole H2 may be more filled with the first conductive layer 161, and thus an aspect ratio of a remaining portion of each of the first hole H1 and the second hole H2 that needs to be filled with the second conductive layer 162 may be reduced. In particular, since the thickness t2 of the portion of the first conductive layer 161 in the second hole H2 increases more than the thickness t1 of the portion of the first conductive layer 161 in the first hole H1, differences in aspect ratios of the remaining portions of the first hole H1 and the second hole H2 that need to be filled with the second conductive layer 162 may be reduced. Accordingly, the first hole H1 and the second hole H2 may be filled with the first conductive layer 161 and the second conductive layer 162 without voids, respectively. The second conductive layer 162 may be formed by, for example, an electroplating process. Since the grain size of the first conductive layer 161 has increased during the reflow operation, the average grain size of the second conductive layer 162 may be less than the average grain size of the portion of the first conductive layer 161 on the bottom of each of the first hole H1 and the second hole H2. However, in some embodiments, when the grain size of the portion of the first conductive layer 161 on the bottom portion of each of the first hole H1 and the second hole H2 approaches the thicknesses t1 and t2 of the portions of the first conductive layer 161 on the bottom of each of the first hole H1 and the second hole H2, a growth of grains of the portion of the first conductive layer 161 on the bottom of each of the first hole H1 and the second hole H2 may be restricted. Thus, after the reflow process, when the thicknesses t1 and t2 of the portions of the first conductive layer 161 on the bottom of the first hole H1 and the second hole H2, respectively, are less than the average grain size of the second conductive layer 162, the average grain size of the portion of the first conductive layer 161 on the bottom of each of the first hole H1 and the second hole H2 may be less than the average grain size of the second conductive layer 162.

For example, in some embodiments, the thickness t1 of the first conductive layer 161 of the first through substrate via V1 may be greater than an average grain size of the first conductive layer 161 of the first through substrate via V1, and the thickness t2 of the first conductive layer 161 of the second through substrate via V2 may be greater than an average grain size of the first conductive layer 161 of the second through substrate via V2. In such embodiments, an average grain size of the second conductive layer 162 of the first through substrate via V1 may be less than the average grain size of the first conductive layer 161 of the first through substrate via V1, and an average grain size of the second conductive layer 162 of the second through substrate via V2 may be less than the average grain size of the first conductive layer 161 of the second through substrate via V2. As another example, in some embodiments, the thickness t1 of the first conductive layer 161 of the first through substrate via V1 may be less than an average grain size of the first conductive layer 161 of the first through substrate via V1, and the thickness t2 of the first conductive layer 161 of the second through substrate via V2 may be less than an average grain size of the first conductive layer 161 of the second through substrate via V2. In such embodiments, an average grain size of the second conductive layer 162 of the first through substrate via V1 may be greater than the average grain size of the first conductive layer 161 of the first through substrate via V1, and an average grain size of the second conductive layer 162 of the second through substrate via V2 may be greater than the average grain size of the first conductive layer 161 of the second through substrate via V2.

Figure 9H:
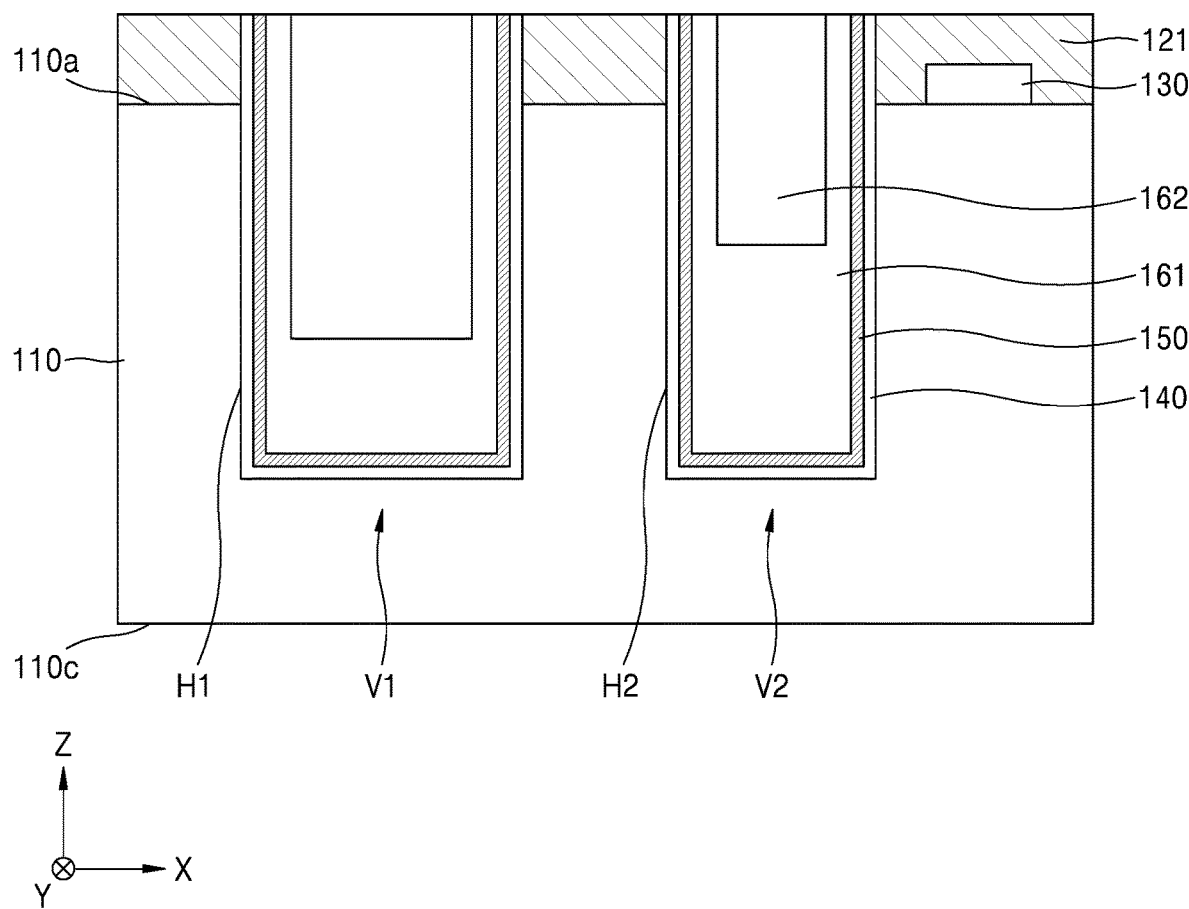

Referring to FIG. 9H, portions of the first conductive layer 161 and the second conductive layer 162 outside the first hole H1 and the second hole H2 may be removed. Portions of the via insulation layer 140 and the barrier layer 150 outside the first hole H1 and the second hole H2 may also be removed. For example, the top portions of the via insulation layer 140, the barrier layer 150, the first conductive layer 161, and the second conductive layer 162 may be polished such that the first interlayer insulating layer 121 is exposed. As a result, the first through substrate via V1 and the second through substrate via V2 may be formed.

Figure 9I:
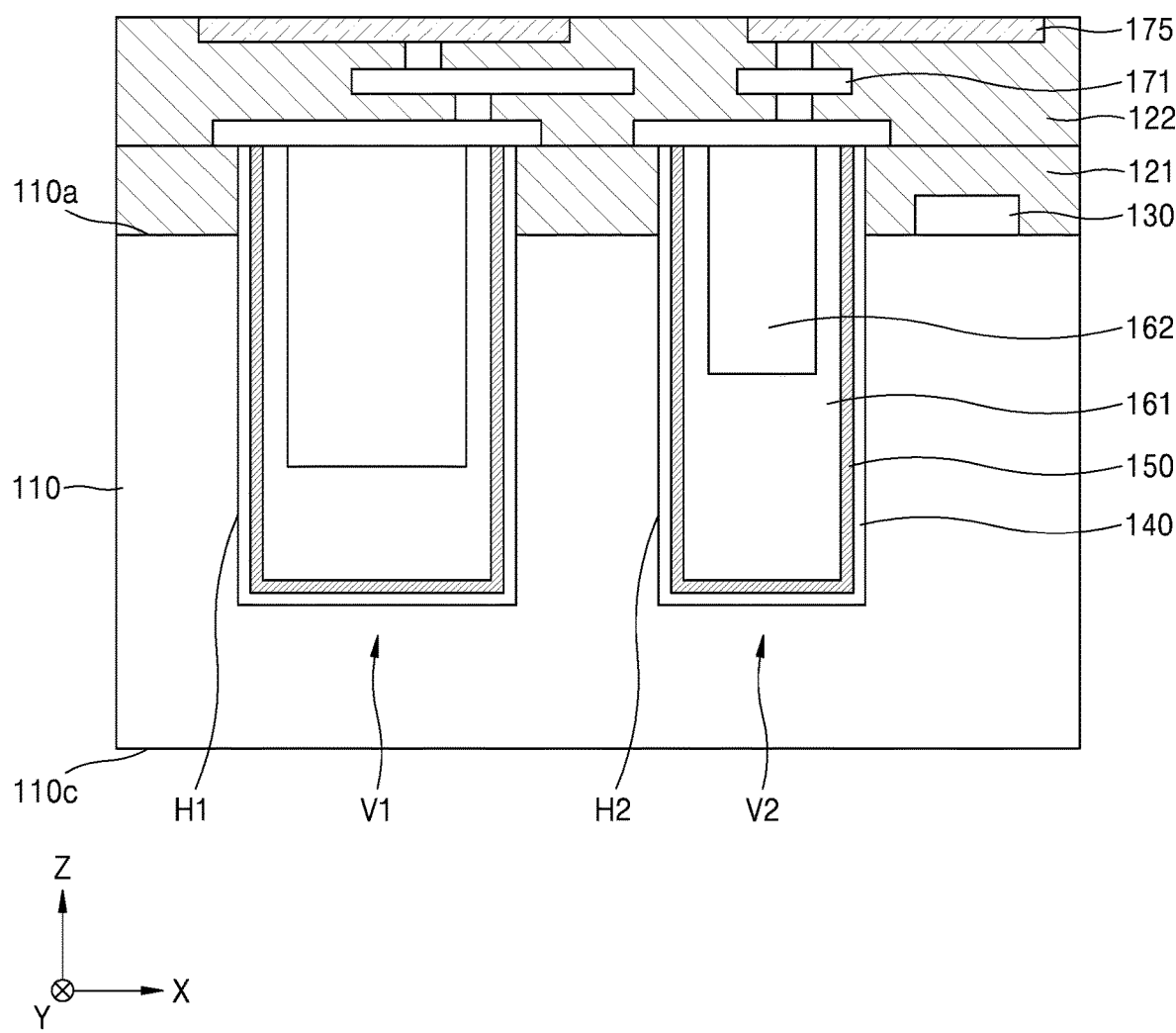

Referring to FIG. 9I, the wirings 171 and the second interlayer insulating layer 122 may be formed on the first interlayer insulating layer 121. A forming operation of the wirings 171 and the second interlayer insulating layer 122 may also be referred to as a back end of line (BEOL) operation. In addition, the bottom pad 175 may be formed on the second interlayer insulating layer 122.

Figure 9J:
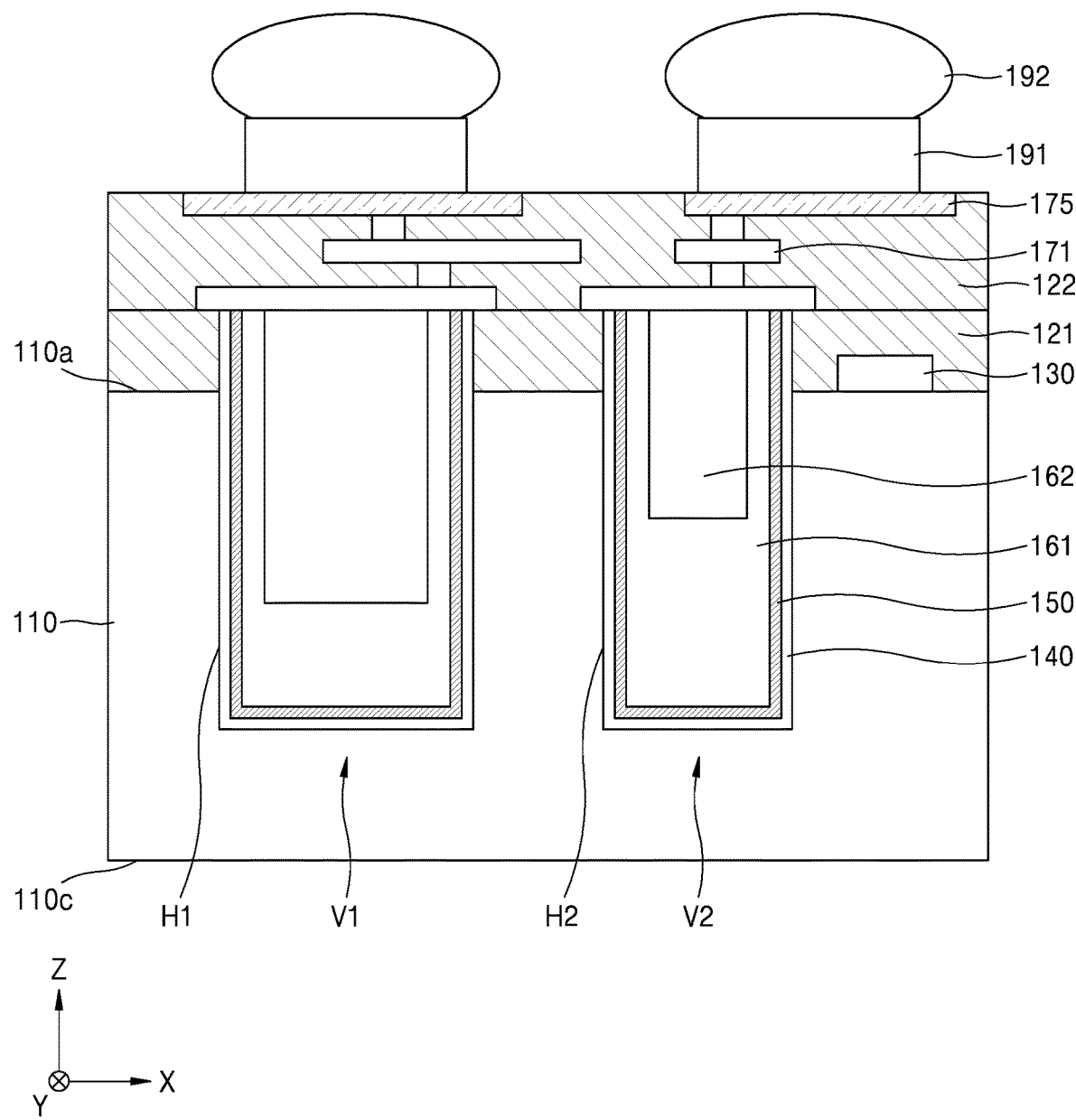

Referring to FIG. 9J, the pillar 191 and the bump 192 may be formed on the bottom pad 175. In some embodiments, the pillar 191 may be omitted. Next, in some embodiments, the substrate 110 may be attached to a carrier (not illustrated) or other substrate such that the first surface 110a of the substrate 110 faces the carrier.

Figure 9K:
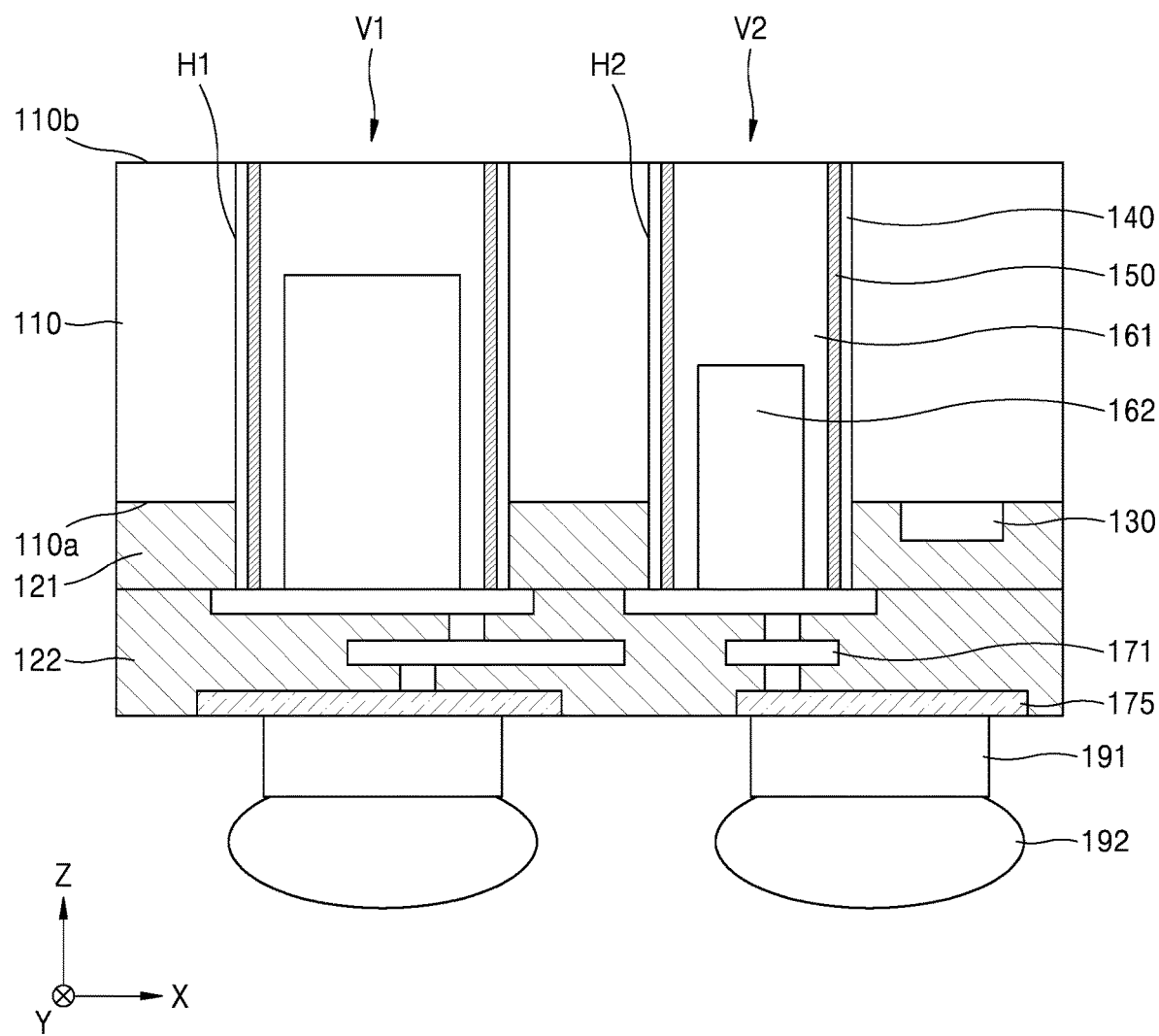

Referring to FIGS. 9J and 9K, by removing a portion extending from the third surface 110c of the substrate 110 toward the first surface 110a of the substrate 110, a thinning operation of the substrate 110 may be performed to expose the first conductive layer 161. As a result, the second surface 110b facing the first surface 110a of the substrate 110 may be formed, and the first through substrate via V1 and the second through substrate via V2 may be exposed.

Figure 9L:
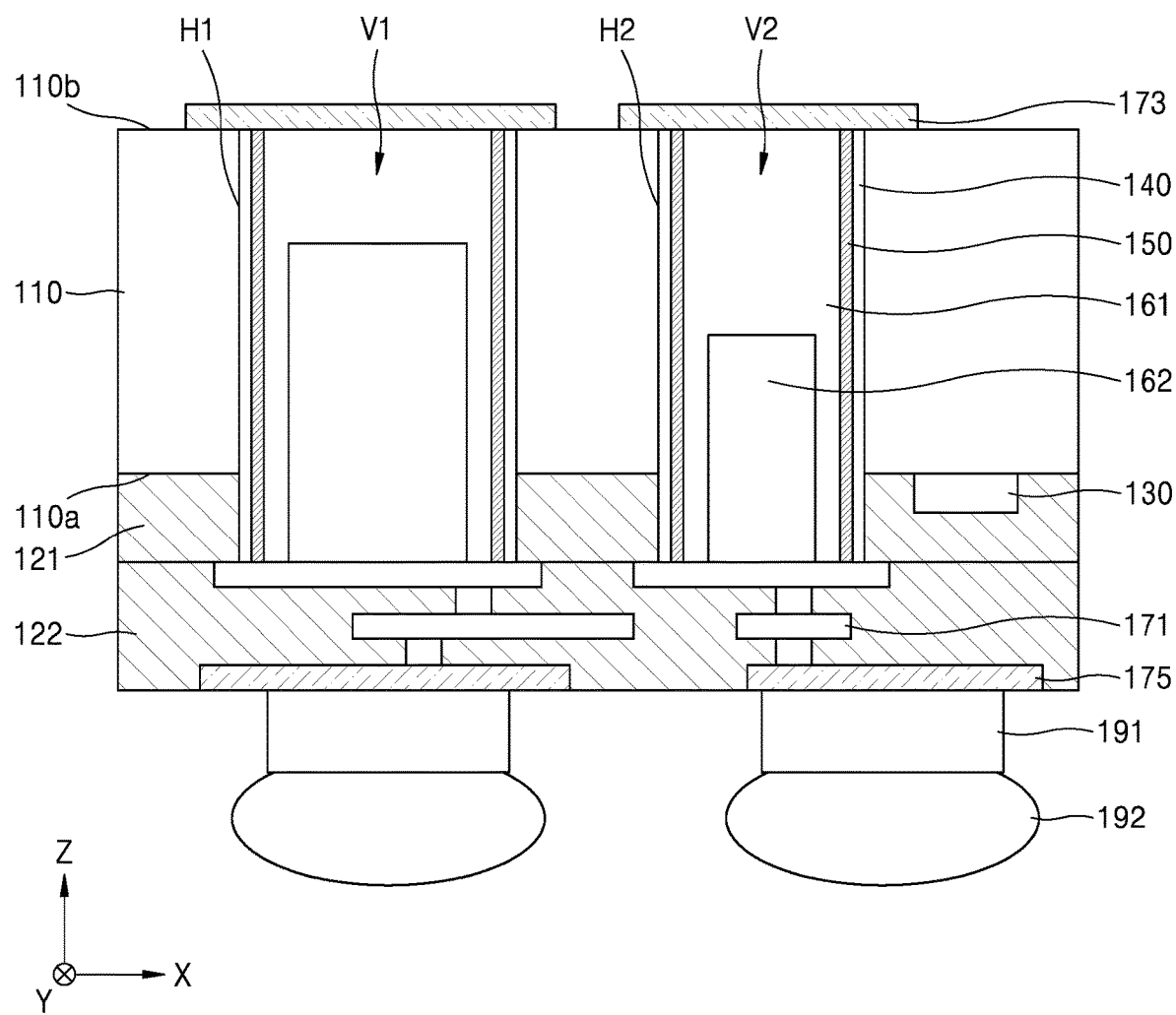

Referring to FIG. 9L, the top pads 173, which are connected to each of the first through substrate via V1 and the second through substrate via V2, may be formed on the second surface 110b of the substrate 110. As a result, the semiconductor device 100C illustrated in FIG. 4 may be completed. In the reflowing operation of the first conductive layer 161 illustrated in FIG. 9F, when portions on the sidewalls of the first hole H1 and the second hole H2 have all been moved to bottom portions of the first hole H1 and the second hole H2, respectively, the first conductive layer 161 may not remain on the sidewalls of the first hole H1 and the second hole H2, and therefore, the semiconductor device 100 illustrated in FIG. 1 may be formed.

In FIGS. 9A through 9L a via-last type may be assumed. For example, after the FEOL process is performed, the first through substrate via V1 and the second through substrate via V2 may be formed, and then the BEOL process may be performed. However, in some embodiments, a via-first type may be assumed. For example, to form the semiconductor device 100B illustrated in FIG. 3, the first through substrate via V1 and the second through substrate via V2 may be formed in the substrate 110, and then, the FEOL process of forming the integrated circuit 130, the conductive pattern 131, and the first interlayer insulating layer 121 may be performed, and thereafter, the BEOL process of forming the wirings 171 and the second interlayer insulating layer 122 may be performed. In addition, in some embodiments, the via-last type may be assumed. After the FEOL process and the BEOL process are performed, the first through substrate via V1 and the second through substrate via V2 may be formed. In some embodiments, a semiconductor device may be manufactured in which the first through substrate via V1 and the second through substrate via V2 pass through both the first interlayer insulating layer 121 and the second interlayer insulating layer 122.

According to an example embodiment of the inventive concept, the reflowing operation of the first conductive layer 161 may include filling the first hole H1 and the second hole H2 having different aspect ratios from each other without voids by the first conductive layer 161 and the second conductive layer 162. Accordingly, the first through substrate via V1 and the second through substrate via V2 having no voids may be formed.

FIGS. 10A through 10J are cross-sectional views illustrating a method of manufacturing the semiconductor device 100D, according to example embodiments of the inventive concept. According to the method of manufacturing illustrated in FIGS. 10A to 10J, the first through substrate via V1 and the second through substrate via V2 may be formed from the second surface 110b opposite to the first surface 110a. For example, the first through substrate via V1 and the second through substrate via V2 may be formed on a side opposite to the side where the integrated circuit 130 has been formed. In the method illustrated in FIGS. 10A through 10J, the via-last type may be assumed.

Figure 10A:
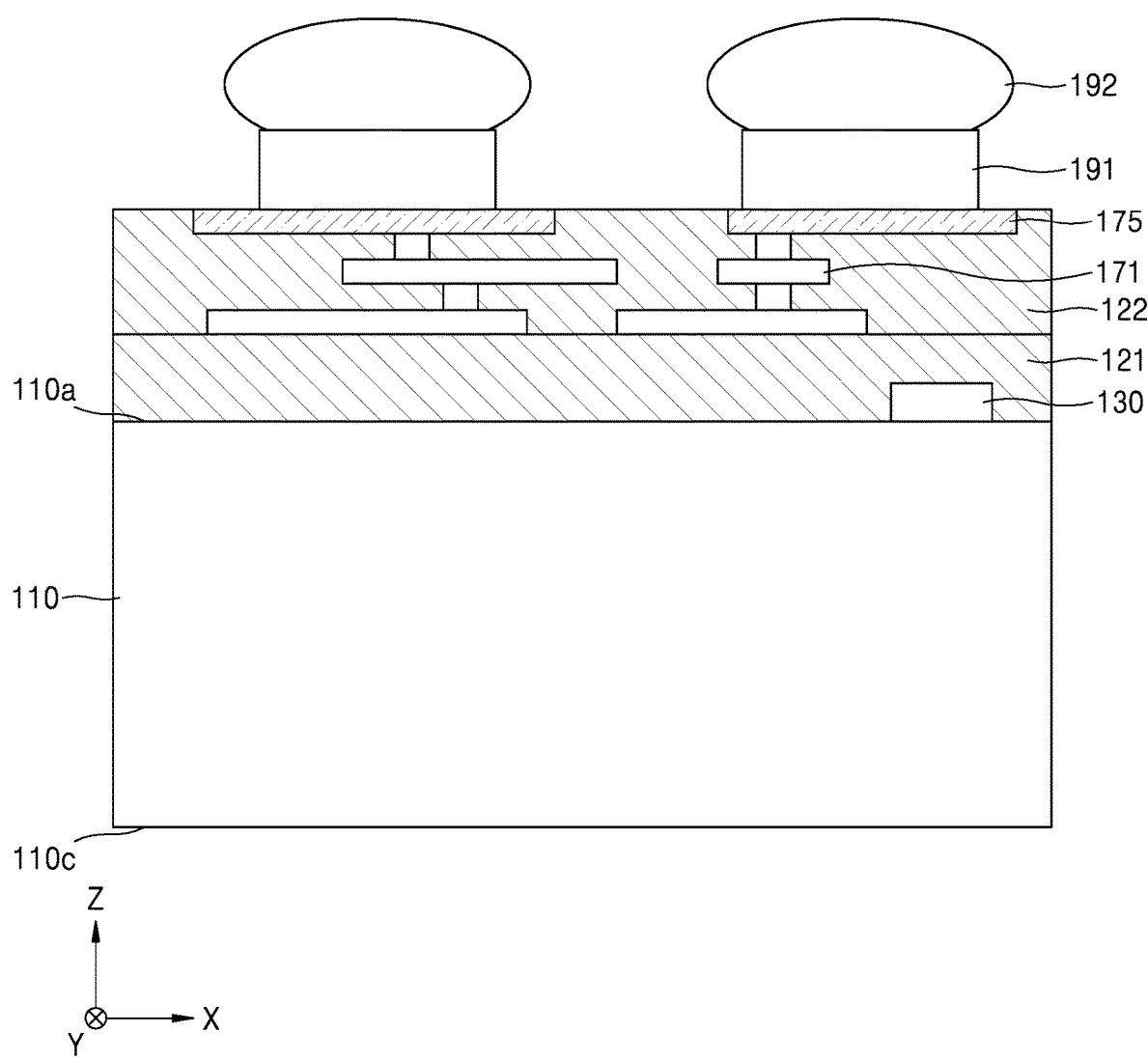
FIGS. 10A through 10J are cross-sectional views illustrating a method of manufacturing a semiconductor device, according to example embodiments of the inventive concept.

Referring to FIG. 10A, first, the integrated circuit 130 and the first interlayer insulating layer 121 may be formed on the first surface 110a of the substrate 110. Next, the wirings 171 and the second interlayer insulating layer 122 may be formed on the first interlayer insulating layer 121. Thereafter, the bottom pad 175, the bump 192, and the pillar 191 may be formed on the second interlayer insulating layer 122. In some embodiments, the bottom pad 175, the bump 192, and the pillar 191 may be formed after the first through substrate via V1 and the second through substrate via V2 are formed. In some embodiments, the substrate 110 may be attached to a carrier (not illustrated) or other substrate such that the first surface 110a of the substrate 110 faces the carrier.

Figure 10B:
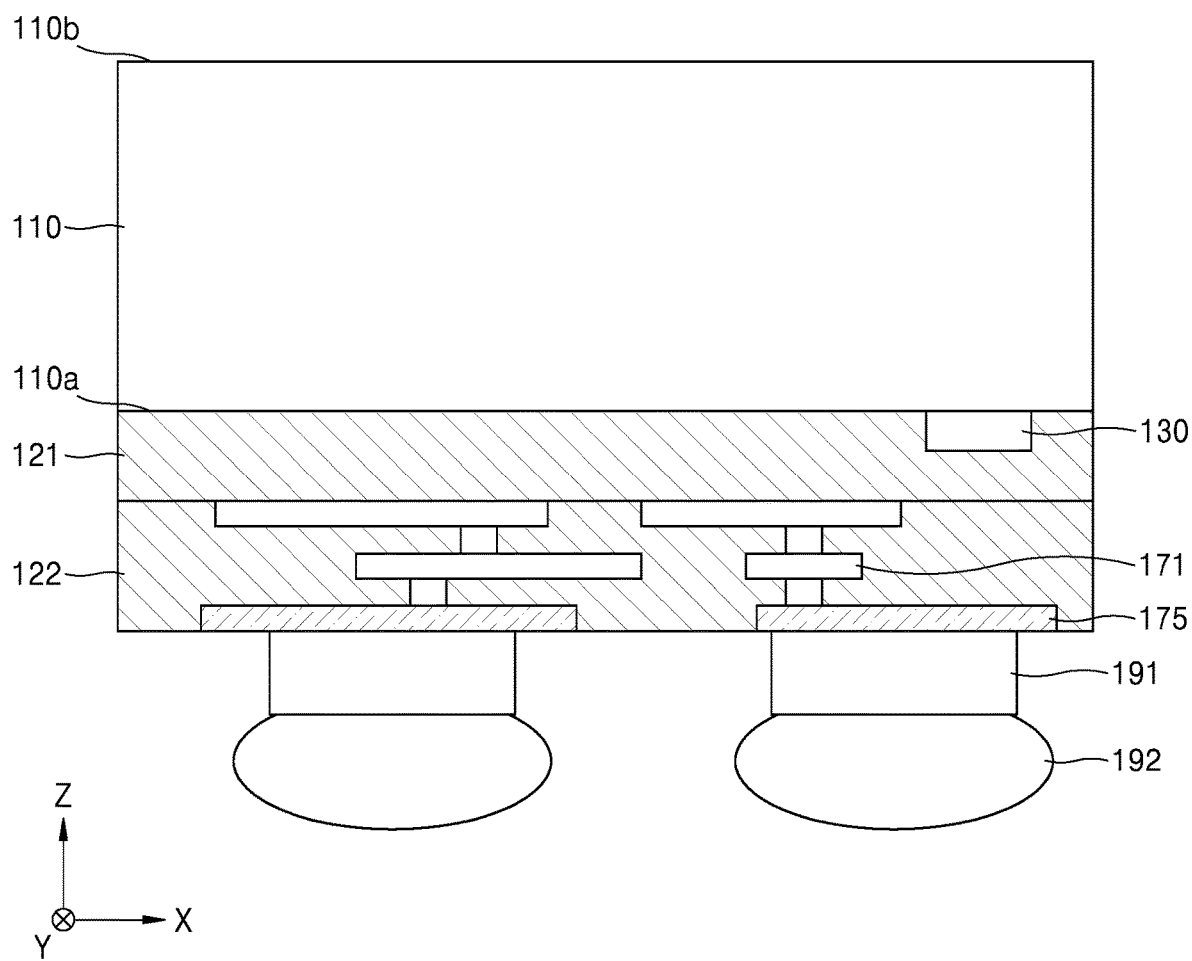

Referring to FIGS. 10A and 10B, the substrate 110 may be thinned by removing a portion from the third surface 110c of the substrate 110. As a result, the second surface 110b of the substrate 110 may be formed.

Figure 10C:
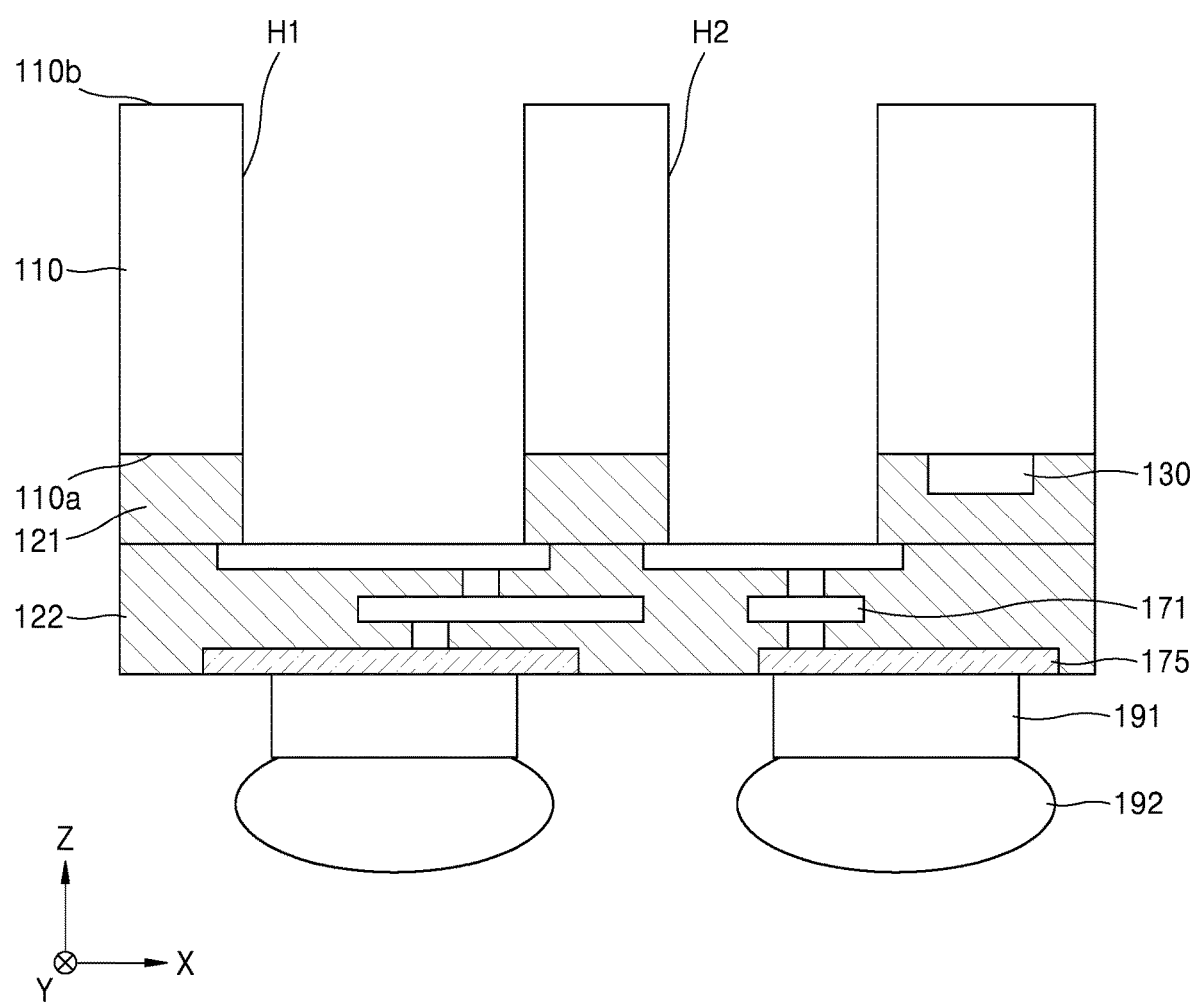

Referring to FIG. 10C, the first hole H1 and the second hole H2 extending from the second surface 110b of the substrate 110 to the first surface 110a of the substrate 110 may be formed. In some embodiments, the first hole H1 and the second hole H2 may further penetrate through the first interlayer insulating layer 121. Unlike FIG. 10C, in some embodiments, the first hole H1 and the second hole H2 may further penetrate through the second interlayer insulating layer 122.

Figure 10D:
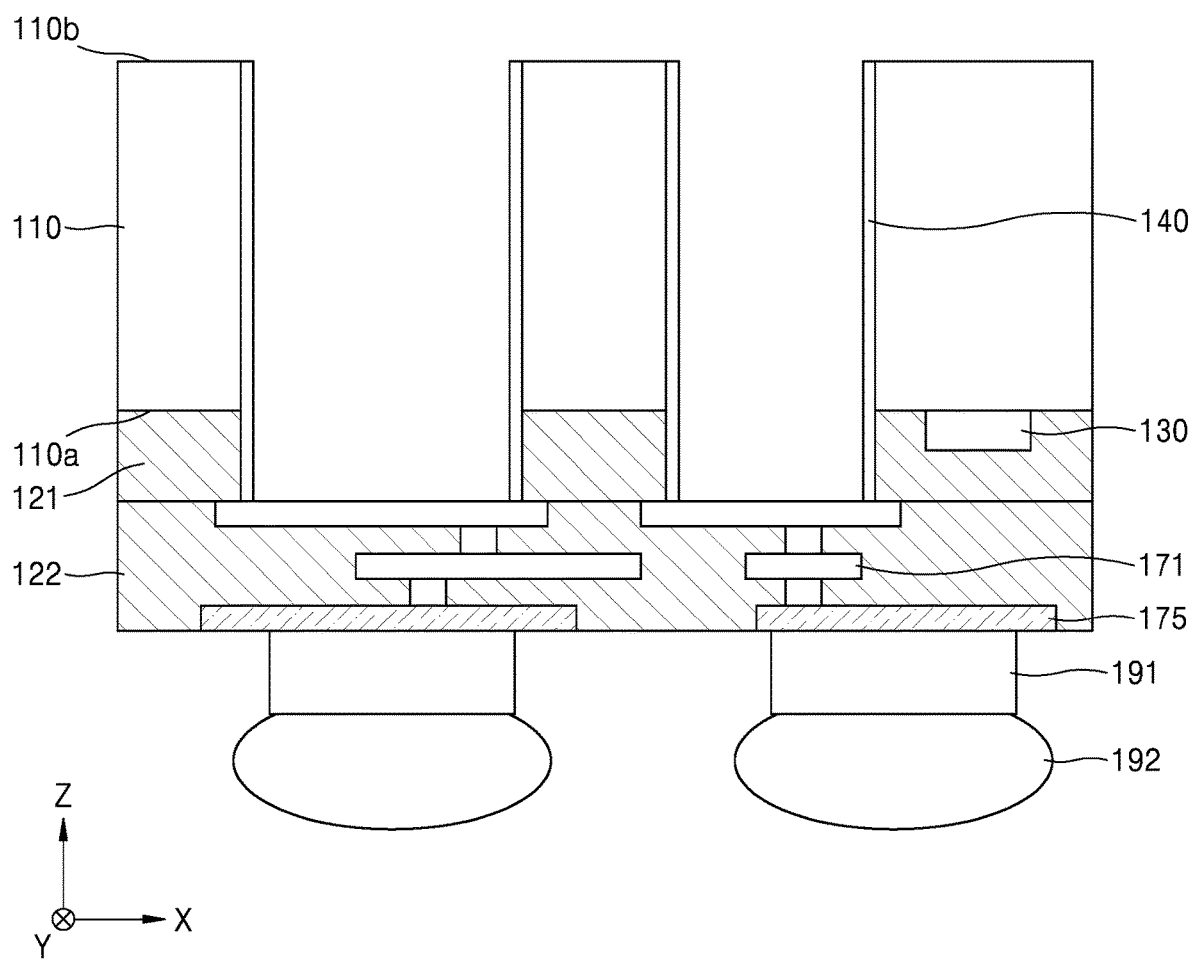

Referring to FIG. 10D, the via insulating layer 140 may be formed on the sidewalls of the first hole H1 and the second hole H2. When the via insulating layer 140 is formed not only on the sidewalls of the first hole H1 and the second hole H2 but also at the bottoms of the first hole H1 and the second hole H2 and on the second surface 110b of the substrate 110, portions of the via insulation layer 140 formed at the bottom portions of the first hole H1 and the second hole H2 may be removed e.g. by anisotropic etching. In some embodiments, the portion of via insulating layer 140 formed on the second surface 110b Of the substrate 110 may also be removed during removal of portions of the via insulating layer 140 formed at the bottoms of the first hole H1 and the second hole H2.

Figure 10E:
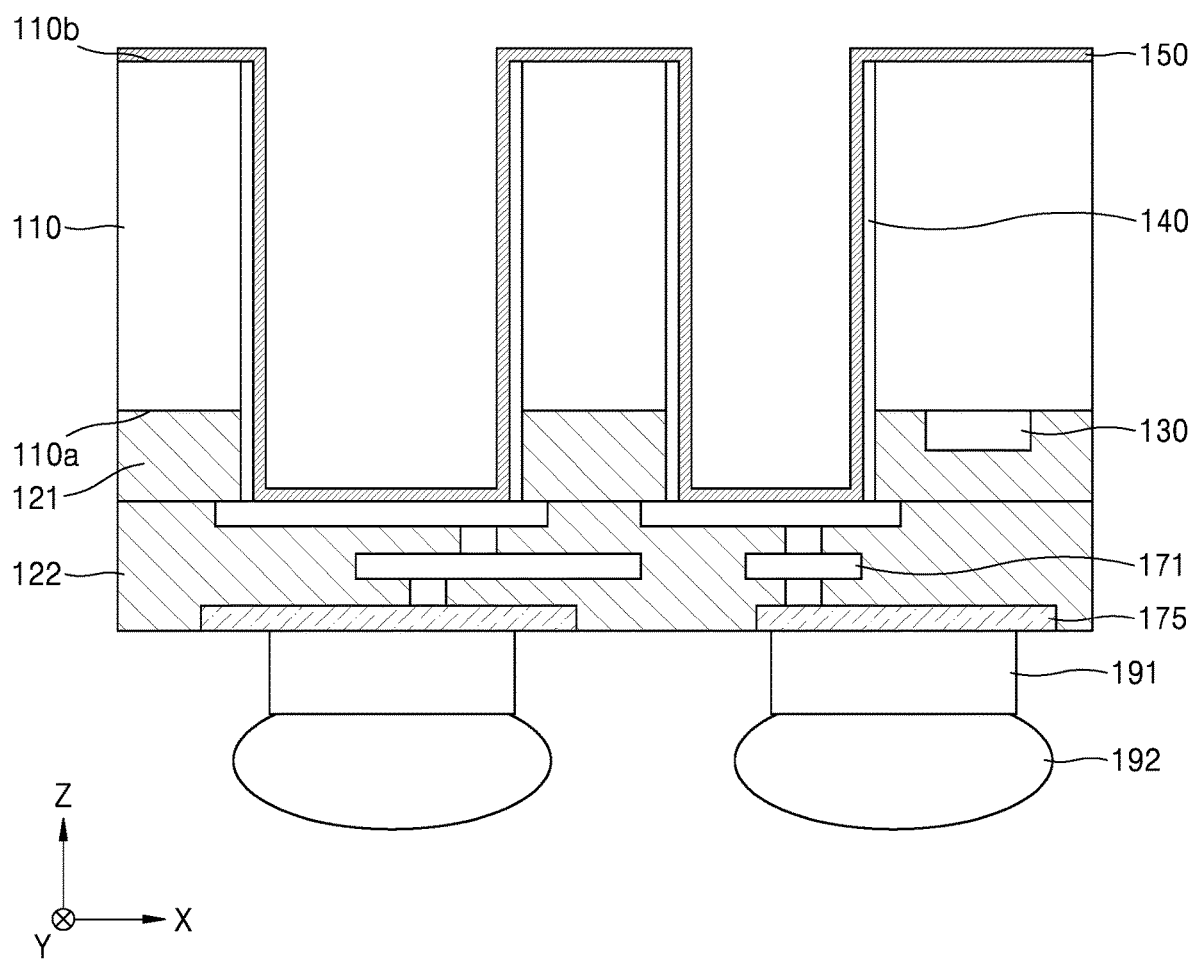

Referring to FIG. 10E, the barrier layer 150 may be formed on the via insulating layer 140. As shown in FIG. 10E, the barrier layer 150 may be formed on the bottoms of the first hole H1 and the second hole H2, and on the second surface 110b of the substrate 110.

Figure 10F:
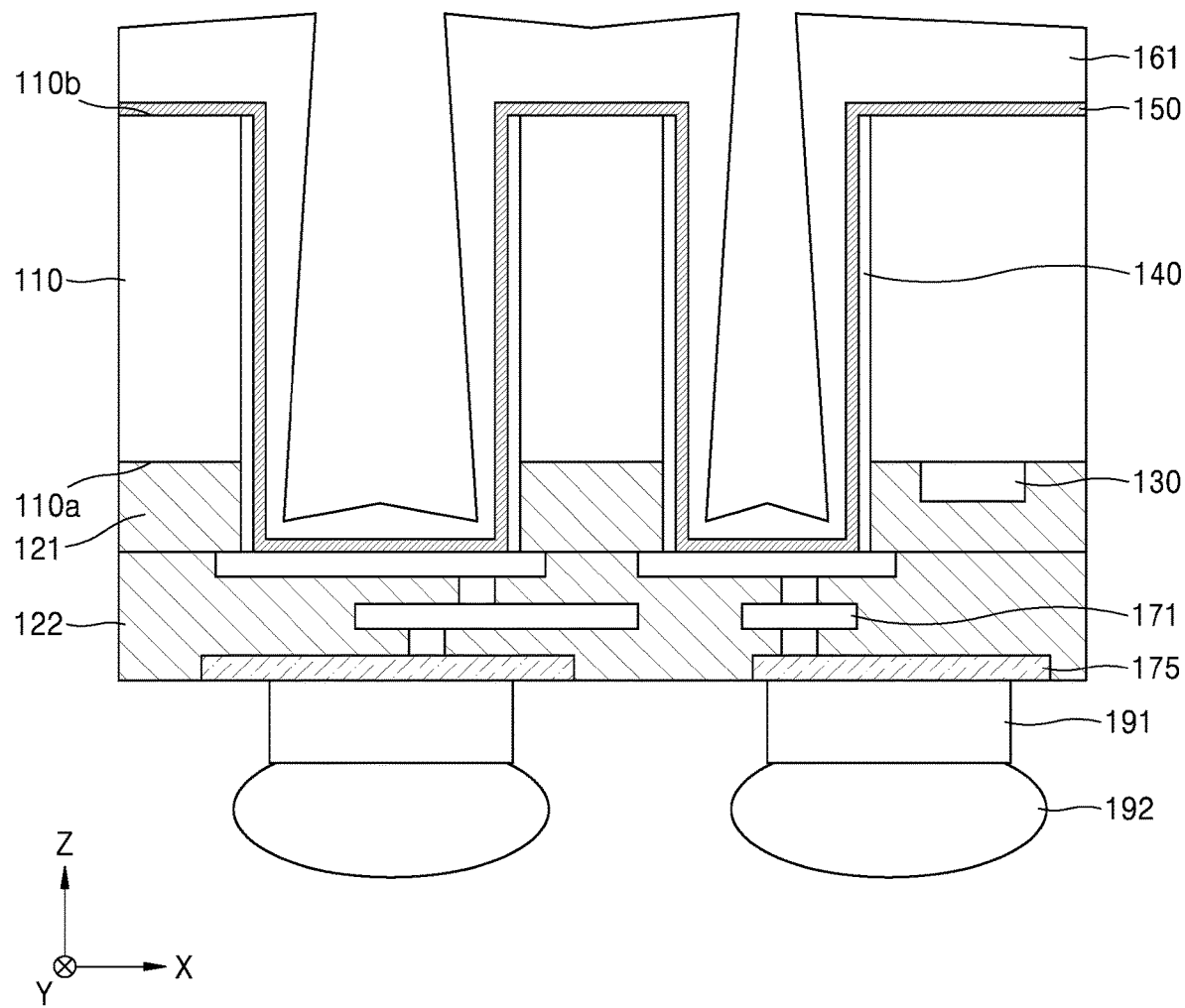

Referring to FIG. 10F, the first conductive layer 161 may be formed on the barrier layer 150, directly contacting the barrier layer 150. The first conductive layer 161 may be formed on the second surface 110b of the substrate 110, in the first hole H1, and in the second hole H2. For example, the first conductive layer 161 may be formed on the second surface 110b of the substrate 110, and on the sidewall and the bottom of each of the first hole H1 and the second hole H2. The thickness of the portion of the first conductive layer 161 formed on the second surface 110b of the substrate 110 may be greater than the thickness of the portion of the first conductive layer 161 formed on the sidewall and the bottom of each of the first hole H1 and the second hole H2.

Figure 10G:
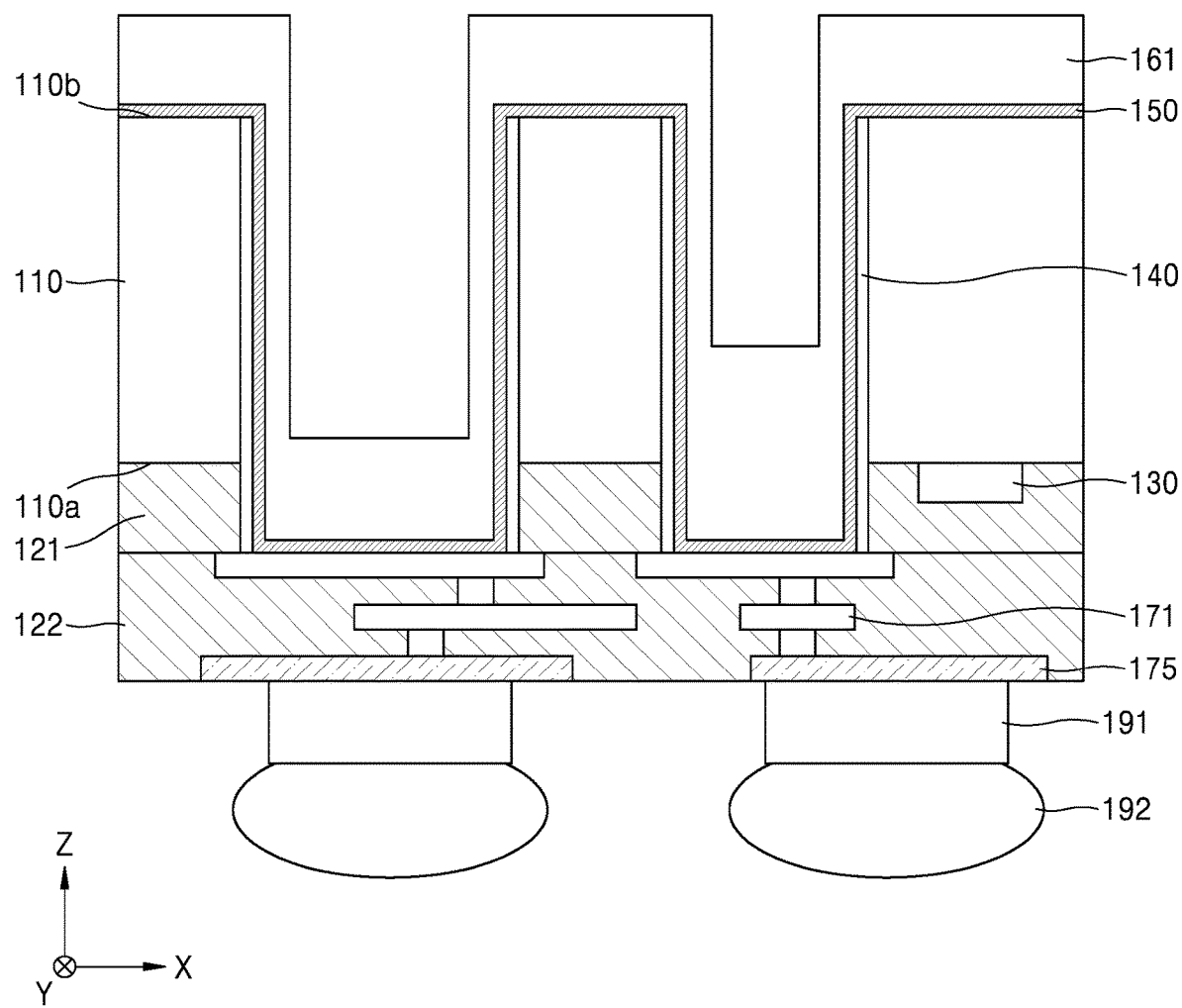

Referring to FIG. 10G, the first conductive layer 161 may be reflowed. The reflow process of FIG. 10G may be the same as that discussed above with respect to FIG. 9F. During the reflow process, at least some of the portions of the first conductive layer 161 on the second surface 110b of the substrate 110 and on the sidewalls of the first hole H1 and the second hole H2 may move to a portion of the first conductive layer 161 on the bottom of the first hole H1 and the second hole H2.

Figure 10H:
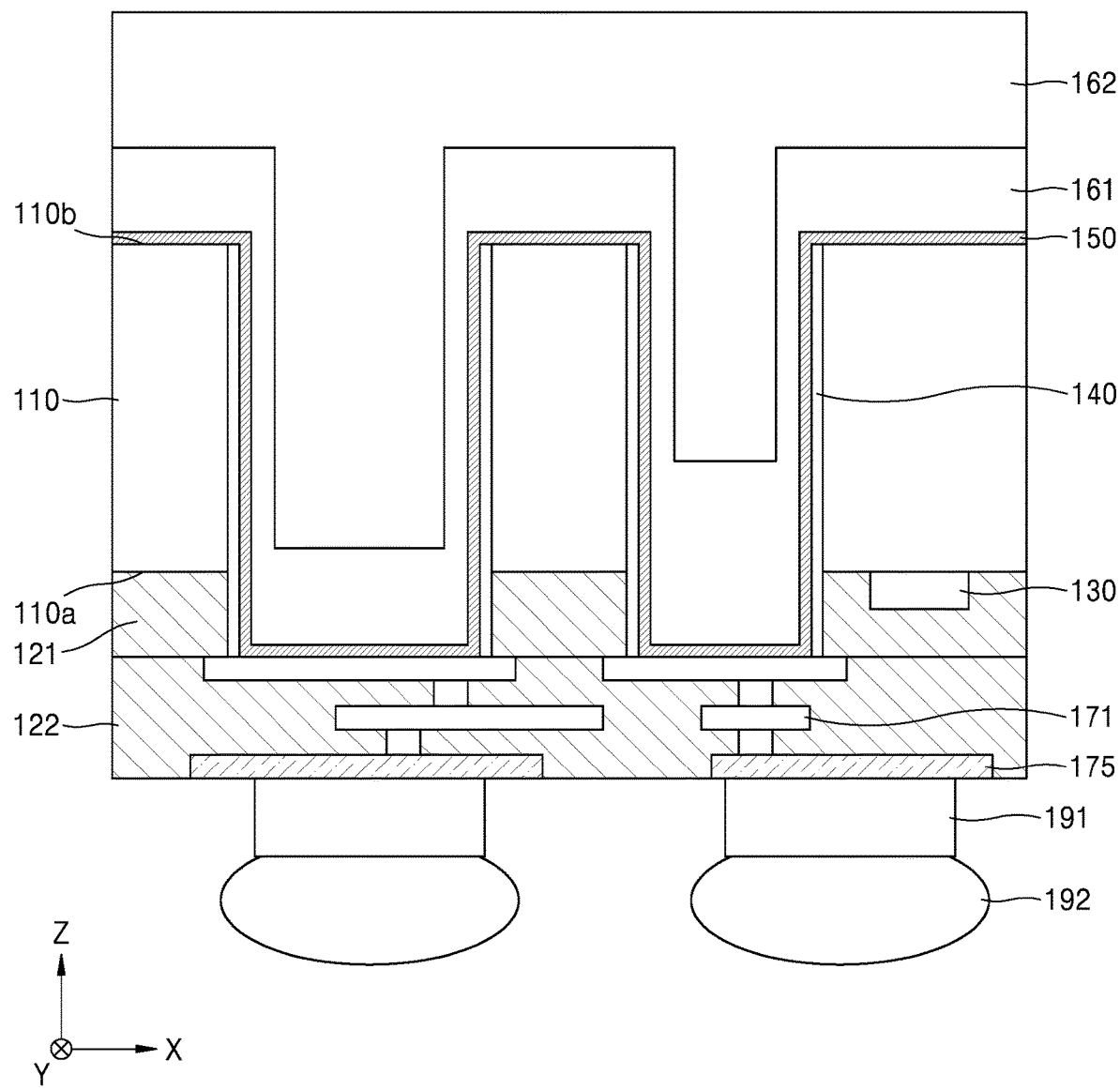

Referring to FIG. 10H, the second conductive layer 162 may be formed on the first conductive layer 161. The second conductive layer 162 may fill the remaining portions of the first hole H1 and the second hole H2.

Figure 10I:
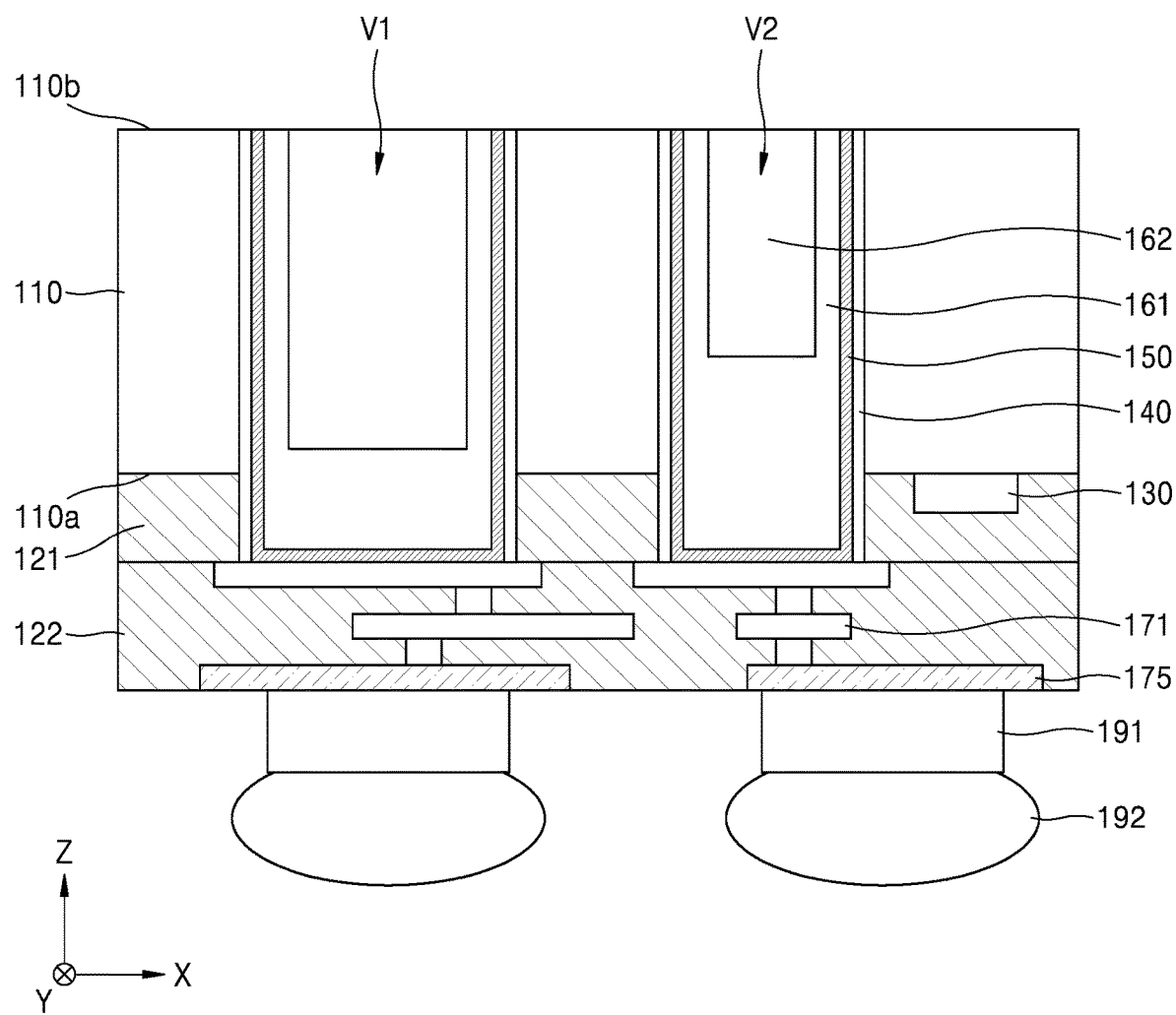

Referring to FIG. 10I, portions of the first conductive layer 161 and the second conductive layer 162 outside the first hole H1 and the second hole H2 may be removed. Portions of the barrier layer 150 outside the first hole H1 and the second hole H2 may also be removed. For example, the top portions of the barrier layer 150, the first conductive layer 161, and the second conductive layer 162 may be polished such that the second surface 110b of the substrate 110 is exposed. As a result, the first through substrate via V1 and the second through substrate via V2 may be formed.

Figure 10J:
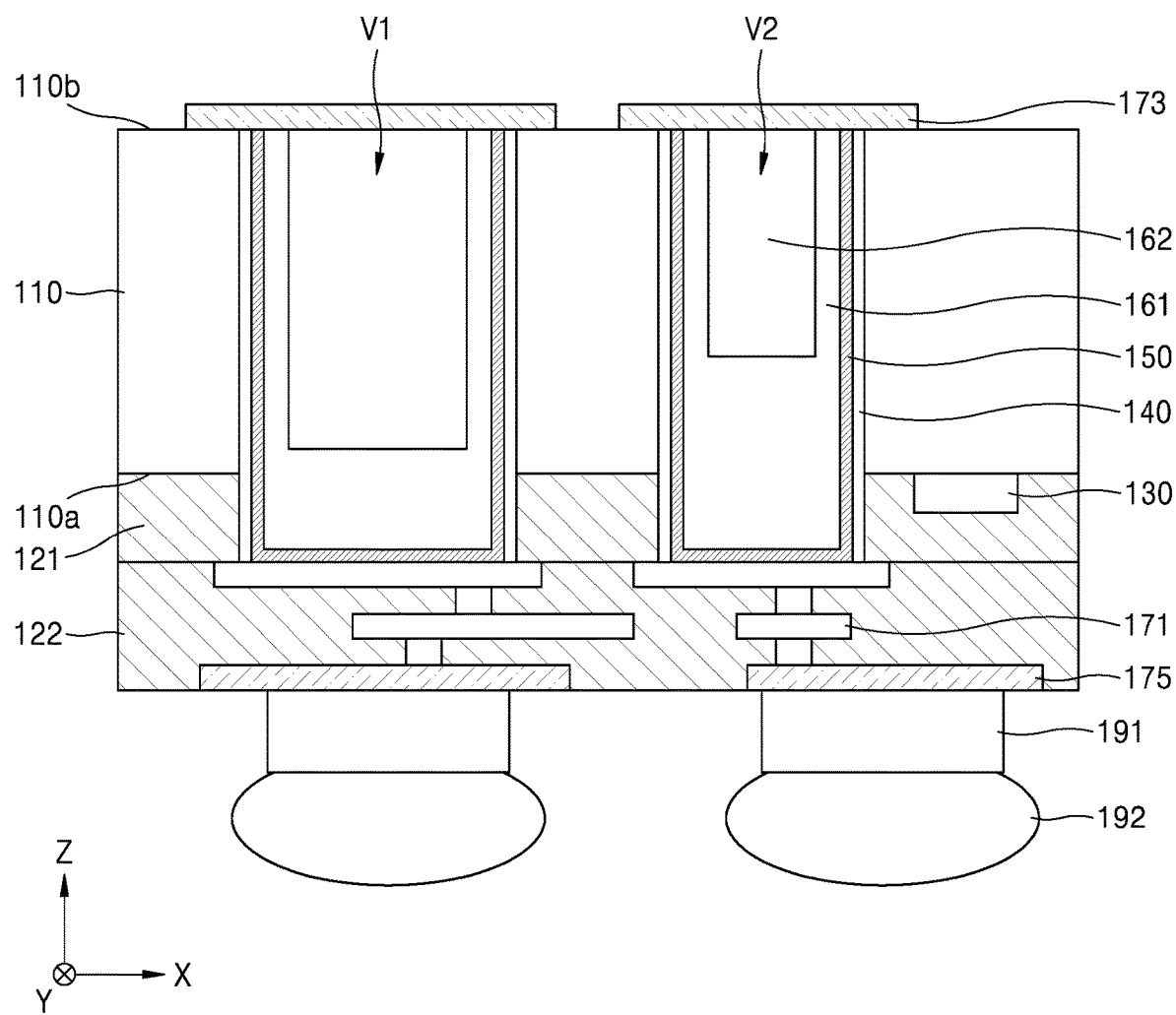

Referring to FIG. 10J, the top pads 173 connected to the first through substrate via V1 and the second through substrate via V2 may be formed on the second surface 110b of the substrate 110. As a result, the semiconductor device 100D illustrated in FIG. 5 may be completed. In the reflowing operation of the first conductive layer 161 illustrated in FIG. 10G, when portions on the sidewalls of the first hole H1 and the second hole H2 have all been moved to the bottom portions of the first hole H1 and the second hole H2, respectively, the first conductive layer 161 may not remain on the sidewalls of the first hole H1 and the second hole H2, and therefore, the semiconductor device 100A illustrated in FIG. 2 may be formed.

While the inventive concept has been particularly shown and described with reference to embodiments thereof, it will be understood that various changes in form and details may be made therein without departing from the spirit and scope of the claims.

What is claimed is:

1. A method of manufacturing a semiconductor device, the method comprising:
   providing a substrate having a first surface and a second surface facing each other;
   forming a first hole extending from the first surface of the substrate toward the second surface of the substrate in a vertical direction and having a first aspect ratio, and a second hole extending from the first surface of the substrate toward the second surface of the substrate in the vertical direction and having a second aspect ratio greater than the first aspect ratio;
   forming a first conductive layer on the first surface of the substrate, in the first hole, and in the second hole;
   reflowing the first conductive layer; and
   forming a second conductive layer on the first conductive layer, wherein, after the reflowing of the first conductive layer, an average grain size of a portion of the first conductive layer on a bottom of the first hole is greater than an average grain size of a portion of the second conductive layer in the first hole, and
   wherein, after the reflowing of the first conductive layer, an average grain size of a portion of the first conductive layer on a bottom of the second hole is greater than an average grain size of a portion of the second conductive layer in the second hole.

2. The method of claim 1,
   wherein the reflowing increases a height of a portion of the first conductive layer on a bottom of each of the first hole and the second hole.

3. The method of claim 1,
   wherein, after the reflowing of the first conductive layer, a thickness of a portion of the first conductive layer on a bottom of the first hole is less than a thickness of a portion of the first conductive layer on a bottom of the second hole.

4. The method of claim 1,
   wherein, after the reflowing of the first conductive layer, a thickness of a portion of the first conductive layer on a bottom of the first hole is greater than a thickness of a portion of the first conductive layer on a sidewall of the first hole.

5. The method of claim 1,
   wherein after the reflowing of the first conductive layer, a thickness of a portion of the first conductive layer on a bottom of the second hole is greater than a thickness of a portion of the first conductive layer on a sidewall of the second hole.

6. The method of claim 1,
   wherein, during the reflowing of the first conductive layer, an average grain size of the first conductive layer increases.

7. The method of claim 1,
   wherein, after the reflowing of the first conductive layer, a thickness of a portion of the first conductive layer on the bottom of the first hole is greater than the average grain size of a portion of the second conductive layer in the first hole.

8. The method of claim 1,
   wherein, after the reflowing of the first conductive layer, a thickness of a portion of the first conductive layer on the bottom of the second hole is greater than the average grain size of a portion of the second conductive layer in the second hole.

9. The method of claim 1, further comprising:
   forming a barrier layer on the first surface of the substrate, in the first hole, and in the second hole before forming the first conductive layer.

10. The method of claim 1,
    wherein a portion of the second conductive layer in each of the first hole and the second hole comprises a first surface perpendicular to the vertical direction, a second surface facing the first surface, and a side surface extending between the first surface and the second surface, and
    wherein a portion of the first conductive layer in each of the first hole and the second hole is on the second surface and the side surface of the portion of the second conductive layer in each of the first hole and the second hole.

11. The method of claim 1,
wherein a material of the first conductive layer and a material of the second conductive layer are the same material.

12. The method of claim 11,
wherein the same material comprises copper or cobalt.

13. A method of manufacturing a semiconductor device, the method comprising:
providing a substrate having a first surface and a second surface facing each other;
forming an integrated circuit on the first surface of the substrate and a first interlayer insulating layer covering the integrated circuit;
forming a first hole configured to penetrate through the first interlayer insulating layer of the substrate, extending from the first surface of the substrate toward the second surface in a vertical direction, and having a first planar cross-sectional area, and a second hole configured to penetrate through the first interlayer insulating layer of the substrate, extending from the first surface of the substrate toward the second surface in the vertical direction, and having a second planar cross-sectional area less than the first planar cross-sectional area;
forming a first conductive layer on the first interlayer insulating layer, in the first hole, and in the second hole;
reflowing the first conductive layer; and
forming a second conductive layer on the first conductive layer.

14. The method of claim 13,
wherein, during the reflowing of the first conductive layer, an average grain size of the first conductive layer increases.

15. The method of claim 13,
wherein, after the reflowing of the first conductive layer, an average grain size of a portion of the first conductive layer on a bottom of the first hole is greater than an average grain size of a portion of the second conductive layer in the first hole, and
wherein, after the reflowing of the first conductive layer, an average grain size of a portion of the first conductive layer on a bottom of the second hole is greater than an average grain size of a portion of the second conductive layer in the second hole.

16. The method of claim 13,
wherein a portion of the second conductive layer in each of the first hole and the second hole comprises a first surface perpendicular to the vertical direction, a second surface facing the first surface, and a side surface extending between the first surface and the second surface, and
wherein a portion of the first conductive layer in each of the first hole and the second hole is on the second surface and the side surface of the portion of the second conductive layer in each of the first hole and the second hole.

17. A method of manufacturing a semiconductor device, the method comprising:
providing a substrate having a first surface and a second surface facing each other;
forming an integrated circuit on the first surface of the substrate and a first interlayer insulating layer covering the integrated circuit;
forming wirings and a second interlayer insulating layer on the first interlayer insulating layer;
thinning the substrate by removing a portion of the substrate extending from the second surface of the substrate toward the first surface such that a third surface facing the first surface is formed;
forming a first hole and a second hole each extending from the third surface of the substrate to the first surface of the substrate in a vertical direction, and having different planar cross-sectional areas from each other;
forming a first conductive layer on the third surface of the substrate, in the first hole, and in the second hole;
reflowing the first conductive layer; and
forming a second conductive layer on the first conductive layer.

18. The method of claim 17,
wherein, during the reflowing of the first conductive layer, an average grain size of the first conductive layer increases.

19. The method of claim 17,
wherein, after the reflowing of the first conductive layer, an average grain size of a portion of the first conductive layer on a bottom of the first hole is greater than an average grain size of a portion of the second conductive layer in the first hole, and
wherein, after the reflowing of the first conductive layer, an average grain size of a portion of the first conductive layer on a bottom of the second hole is greater than an average grain size of a portion of the second conductive layer in the second hole.

20. The method of claim 17,
wherein a portion of the second conductive layer in each of the first hole and the second hole comprises a first surface perpendicular to the vertical direction, a second surface facing the first surface, and a side surface extending between the first surface and the second surface, and
wherein a portion of the first conductive layer in each of the first hole and the second hole is on the second surface and the side surface of the portion of the second conductive layer in each of the first hole and the second hole.

* * * * *